(12) United States Patent
Seo et al.

(10) Patent No.: US 11,729,981 B2
(45) Date of Patent: Aug. 15, 2023

(54) SEMICONDUCTOR DEVICE AND METHOD OF MANUFACTURING THE SAME

(71) Applicant: SK hynix Inc., Gyeonggi-do (KR)

(72) Inventors: Moon Sik Seo, Gyeonggi-do (KR); Gil Bok Choi, Daejeon (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/707,469

(22) Filed: Mar. 29, 2022

(65) Prior Publication Data

US 2022/0223620 A1 Jul. 14, 2022

Related U.S. Application Data

(63) Continuation of application No. 16/661,291, filed on Oct. 23, 2019, now Pat. No. 11,315,944.

(30) Foreign Application Priority Data

Jun. 11, 2019 (KR) .......................... 10-2019-0068902

(51) Int. Cl.
*H10B 43/27* (2023.01)
*H10B 41/20* (2023.01)
*H10B 41/30* (2023.01)

(52) U.S. Cl.
CPC ............. *H10B 43/27* (2023.02); *H10B 41/20* (2023.02); *H10B 41/30* (2023.02)

(58) Field of Classification Search
None
See application file for complete search history.

(56) References Cited

U.S. PATENT DOCUMENTS

2017/0018563 A1* 1/2017 Nishida ............... H01L 29/7926

* cited by examiner

*Primary Examiner* — Michelle Mandala
*Assistant Examiner* — Jordan M Klein
(74) *Attorney, Agent, or Firm* — IP&T Group LLP

(57) ABSTRACT

The present technology provides a semiconductor device and a method of manufacturing the same. The semiconductor device includes a channel structure, insulating structures surrounding the channel structure and stacked to be spaced apart from each other, interlayer insulating films surrounding the insulating structures, respectively, and a gate electrode extending from between the interlayer insulating films to between the insulating structures and surrounding the channel structure. The insulating structures may include protrusion portions extending to cover edges of the interlayer insulating films facing the channel structure, and the gate electrode may extend between the protrusion portions which are adjacent to each other.

11 Claims, 22 Drawing Sheets

SEMICONDUCTOR DEVICE AND METHOD OF MANUFACTURING THE SAME

CROSS-REFERENCE TO RELATED APPLICATION

This application is a continuation of U.S. patent application Ser. No. 16/661,291 filed on Oct. 23, 2019, which claims benefits of priority of Korean Patent Application No. 10-2019-0068902 filed on Jun. 11, 2019. The disclosure of each of the foregoing application is incorporated herein by reference in its entirety.

BACKGROUND

1. Field of Invention

The present disclosure relates to a semiconductor device and a method of manufacturing the same, and more particularly to a three-dimensional semiconductor device and a method of manufacturing the same.

2. Description of Related Art

A semiconductor device may include a memory cell array including a plurality of memory cells. The memory cell array may include memory cells disposed in various structures. In order to improve an integration degree of a semiconductor device, a three-dimensional semiconductor device including three-dimensionally arranged memory cells has been proposed.

However, reliability of the three-dimensional semiconductor device may be reduced by various causes.

SUMMARY

A semiconductor device according to an embodiment of the present invention may include a channel structure, insulating structures surrounding the channel structure and stacked to be spaced apart from each other, interlayer insulating films surrounding the insulating structures, respectively, and a gate electrode extending from between the interlayer insulating films to between the insulating structures and surrounding the channel structure. The insulating structures may include protrusion portions extending to cover edges of the interlayer insulating films facing the channel structure, and the gate electrode may extend between the protrusion portions which are adjacent to each other.

The insulating structures may include sidewalls facing the interlayer insulating films. The interlayer insulating films may be respectively inserted into grooves defined by the sidewalls and the protrusion portions of the insulating structures.

In an embodiment, the insulating structures may include a first material pattern disposed between each of the interlayer insulating films and the channel structure, and a second material pattern covering each of the edges of the interlayer insulating films and configured of oxide of the first material pattern.

In an embodiment, the insulating structures may include a first material pattern disposed between each of the interlayer insulating films and the channel structure, a second material pattern covering each of the edges of the interlayer insulating films, and a void disposed between the first material pattern and the second material pattern.

A semiconductor device according to an embodiment of the present invention may include a channel structure, a memory film including a tunnel insulating film surrounding a sidewall of the channel structure, a data storage film surrounding a sidewall of the tunnel insulating film, and a blocking insulating film surrounding a sidewall of the data storage film, first material patterns surrounding the memory film and stacked to be spaced apart from each other, interlayer insulating films surrounding the first material patterns, respectively, a gate electrode extending from between the interlayer insulating films which are adjacent to each other to between the first material patterns which are adjacent to each other, and second material patterns disposed between the first material patterns and the gate electrode.

In an embodiment, the second material patterns may be configured of oxide of the first material patterns.

In an embodiment, the second material patterns may include a porous insulating material.

The semiconductor device may further include a void formed between the first and second material patterns which are adjacent to each other.

A semiconductor device according to an embodiment of the present invention may include a stack of a first and second gate electrodes separated with an interlayer insulating film disposed between the first and second gate electrodes, a channel structure penetrating through the stack, an insulating structure disposed between the interlayer insulating film and the channel structure, and the insulating structure including a vertical part and first and second protrusion portions at a first and second ends of the vertical part. The first and second protrusion portions may separate respective recessed portions of the first and second gate electrodes from the channel structure.

A method of manufacturing a semiconductor device according to an embodiment of the present invention may include forming a stack body in which interlayer insulating films and sacrificial films are alternately stacked, forming a hole penetrating the stack body, forming a first material film on an inner wall of the hole, forming a channel structure in a center region of the hole opened by the first material film, removing the sacrificial films of the stack body to form opening portions exposing the first material film, removing exposed regions of the first material film through the opening portions so that the first material film is divided into first material patterns, forming second material patterns by oxidizing a portion of the first material patterns from an etched surface of each of the first material patterns, and forming gate electrodes filling the opening portions and extending between the second material patterns.

A method of manufacturing a semiconductor device according to an embodiment of the present invention may include forming a stack body in which interlayer insulating films and sacrificial films are alternately stacked, forming a hole penetrating the stack body, forming a first material film on an inner wall of the hole, forming a memory film on the first material film, forming a channel structure in a center region of the hole opened by the memory film, removing the sacrificial films of the stack body to form first opening portions exposing the first material film, etching the first material film through the first opening portions so that second opening portions are defined between the interlayer insulating films and the memory film, forming second material patterns in the second opening portions, and forming gate electrodes filling the first opening portions and extending between the second material patterns.

In an embodiment, the second material patterns may include a porous insulating material filling the second opening portions.

In an embodiment, the forming the second material patterns may include forming a second material film along surfaces of the interlayer insulating films so that a void is formed in each of the second opening portions, and etching the second material film so that the second material patterns remain on edges of the interlayer insulating films facing the channel structure.

These and other features and advantages of the present invention will become apparent to those skilled in the art of the invention from the following detailed description in conjunction with the following drawings.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It is noted that reference to "an embodiment," "another embodiment" or the like does not necessarily mean only one embodiment, and different references to any such phrase are not necessarily to the same embodiment(s).

The drawings are not necessarily to scale and, in some instances, proportions may have been exaggerated in order to clearly illustrate features of the embodiments.

In addition, it will also be understood that when an element is referred to as being "between" two elements, it may be the only element between the two elements, or one or more intervening elements may also be present.

It should also be noted that features present in one embodiment may be used with one or more features of another embodiment without departing from the scope of the invention.

It is further noted, that in the various drawings, like reference numbers designate like elements.

Embodiments of the present disclosure provide a semiconductor device with improved reliability and a method of manufacturing the same.

Figure 1:
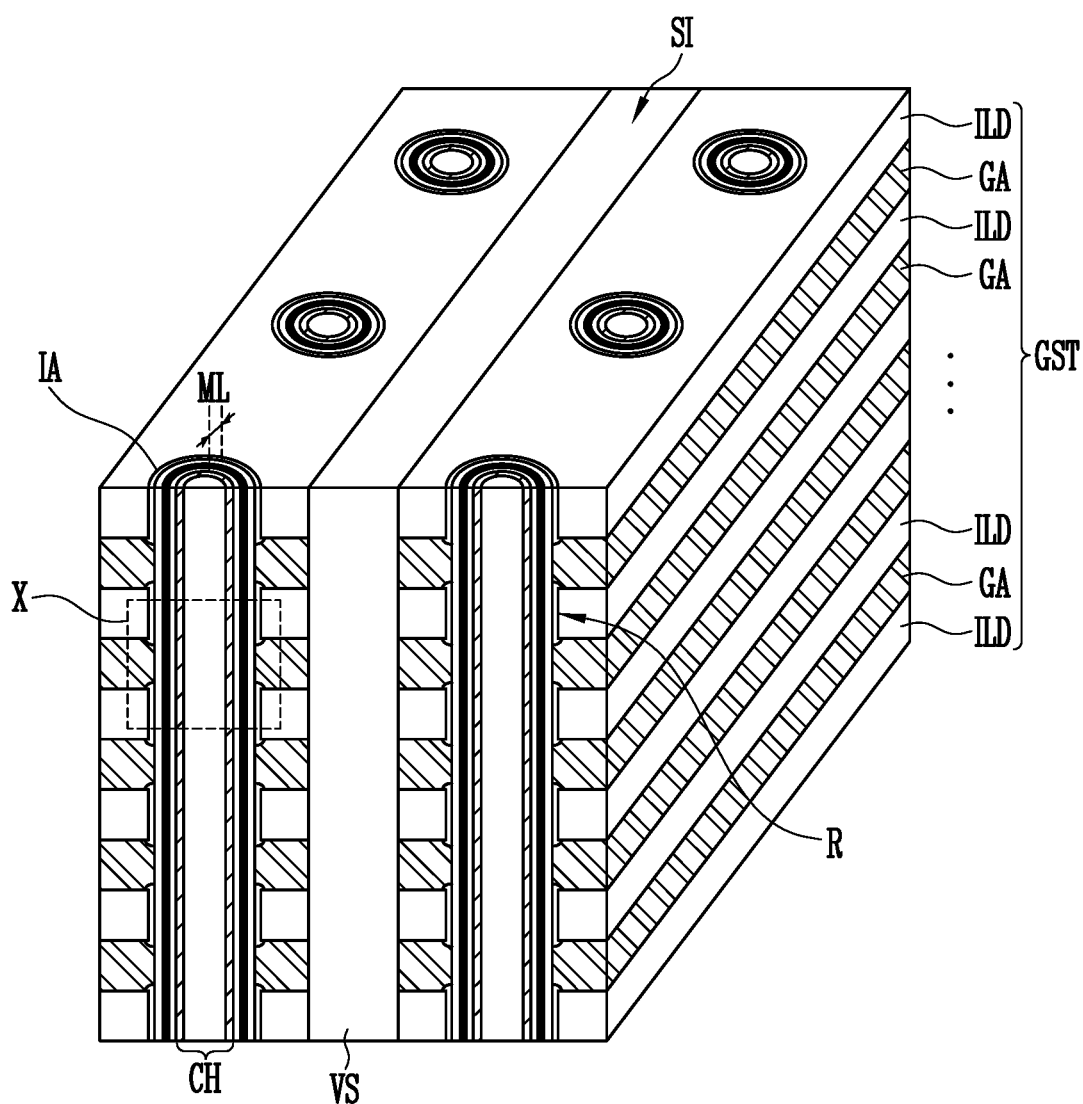
FIG. 1 is a perspective view illustrating a portion of a semiconductor device according to an embodiment of the present disclosure.

FIG. 1 is a perspective view illustrating a portion of a semiconductor device according to an embodiment of the present disclosure.

Referring to FIG. 1, the semiconductor device may include gate stack bodies GST separated from each other by a slit SI, a channel structure CH penetrating each of the gate stack bodies GST, a memory film ML surrounding a sidewall of the channel structure CH, insulating structures IA which surround the memory film ML and are stacked to be spaced apart from each other.

The slit SI may be filled with a material to form a vertical structure VS. In an embodiment, the material of the vertical structure VS may include an insulating material. In another embodiment, the vertical structure VS may include spacer insulating films formed on sidewalls of the gate stack bodies GST, and a conductive material filling the slits SI between the spacer insulating films.

Each of the gate stack bodies GST may include interlayer insulating films ILD and gate electrodes GA which are alternately stacked in one direction. Hereinafter, a direction in which the interlayer insulating films ILD and the gate electrodes GA are alternately stacked is referred to as a stack direction.

The insulating structures IA may surround the channel structure CH and be spaced apart from each other in the stack direction. The insulating structures IA may be surrounded by the interlayer insulating films ILD, respectively. In other words, each of the insulating structures IA may be disposed between the corresponding interlayer insulating film ILD and channel structure CH. Each of the insulating structures IA may include a sidewall facing the corresponding interlayer insulating film ILD. A groove R may be defined in the sidewall of each of the insulating structures IA facing the corresponding interlayer insulating film ILD. Each interlayer insulating film ILD may be inserted in a corresponding groove R.

Each of the interlayer insulating films ILD may protrude to an external device of the groove R from the corresponding groove R toward the vertical structure VS. The interlayer insulating films ILD may be made of any suitable insulating material. For example, the interlayer insulating films ILD may be or include a silicon oxide film.

The gate electrodes GA may be or include at least one of a doped semiconductor, a metal, a metal silicide, and a metal nitride film. The gate electrodes GA may be used as a gate electrode of a memory cell or a gate electrode of a select transistor.

The channel structure CH may extend in the stack direction and may be surrounded by the gate electrodes GA. The sidewall of the channel structure CH may be surrounded by the memory film ML.

The memory film ML may extend between the insulating structures IA and the channel structure CH, and between the gate electrodes GA and the channel structure CH.

Figure 2A:
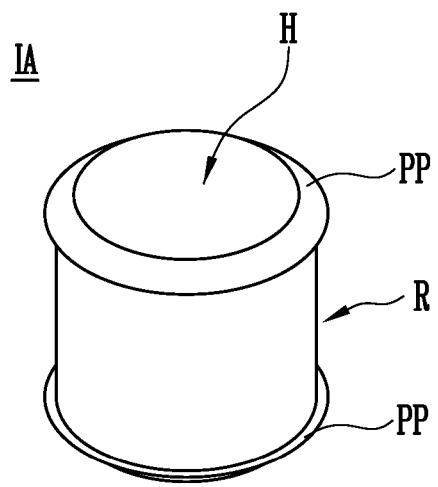
FIGS. 2A to 2C are enlarged views of insulating structures shown in FIG. 1.
Figure 2B:
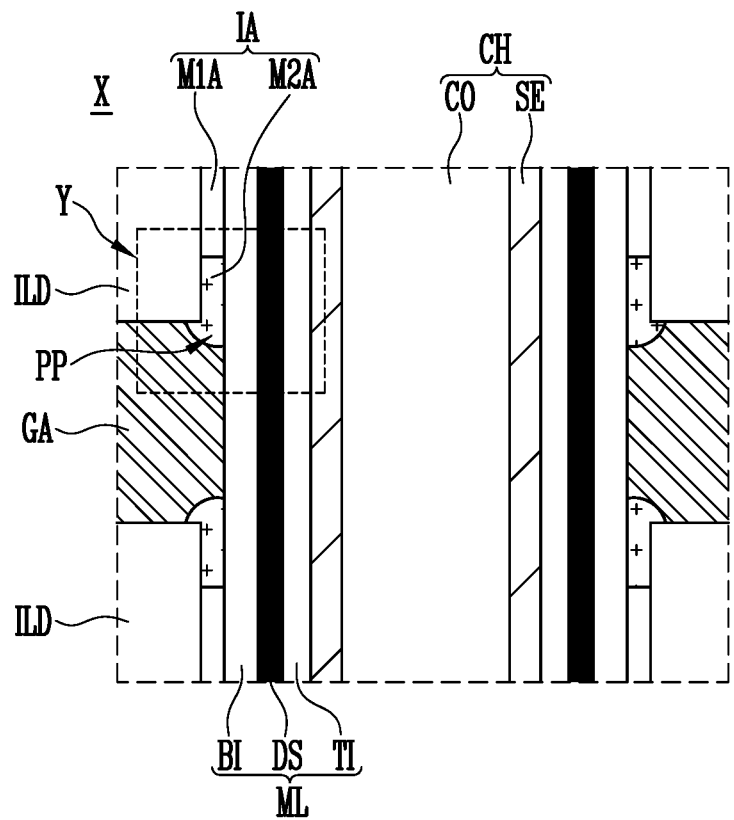
Figure 2C:
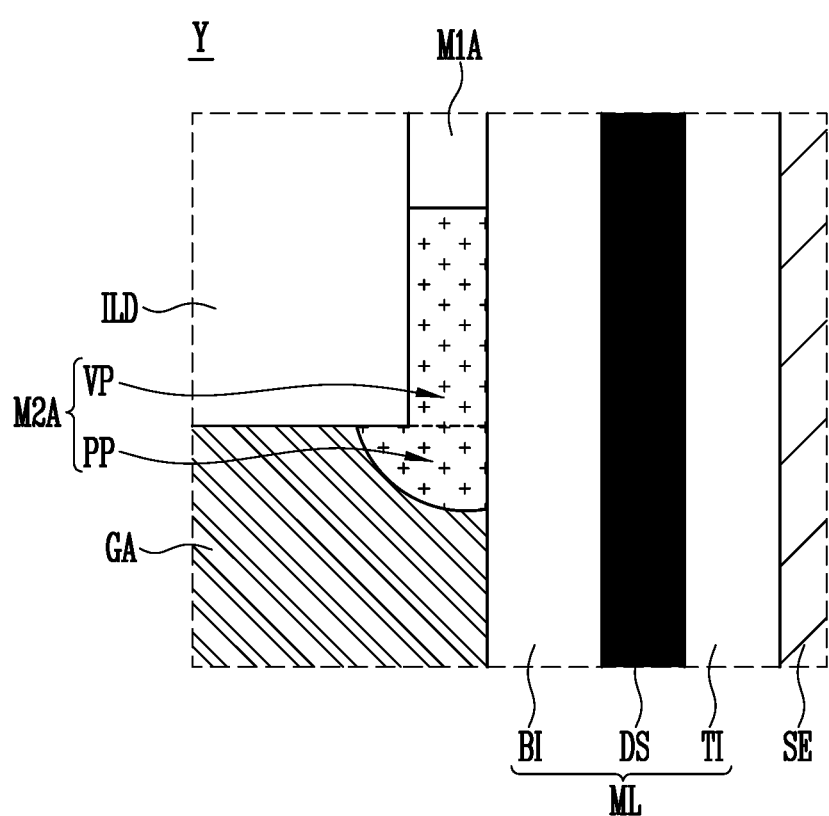

FIGS. 2A to 2C are enlarged views of the insulating structures IA shown in FIG. 1. FIG. 2A is a perspective view illustrating one of the insulating structures IA, FIG. 2B is an enlarged view of an X region shown in FIG. 1, and FIG. 2C is an enlarged view of a Y region shown in FIG. 2B.

Referring to FIG. 2A, the insulating structure IA may surround a hole H so that the hole H is defined in a center region. The hole H of the insulating structure IA may be filled with the memory film ML and the channel structure CH described above with reference to FIG. 1. The insulating structure IA may define the groove R described above with reference to FIG. 1. The groove R may be defined between protrusion portions PP respectively formed at an upper end and a lower end of the insulating structure IA.

Referring to FIG. 2B, the gate electrode GA may be disposed between two consecutive interlayer insulating films ILD in the stack direction, i.e., two interlayer insulating films ILD which are adjacent to each other in the stack direction. The gate electrode GA may extend from between the interlayer insulating films ILD and also between the insulating structures IA adjacent to each other in the stack direction. The insulating structures IA may include the protrusion portions PP as described above with reference to FIG. 2A. Specifically, the gate electrode GA may extend between the pair of adjacent protrusion portions PP in the stack direction. The gate electrode GA may include recessed portions in a shape corresponding to the protrusion portions PP. The recessed portions of the gate electrode GA may have a shape that is complementary to the shape of the corresponding protrusion portions PP. The recessed portions of the gate electrode GA may be located at corner edges of the gate electrode GA that are proximate to the channel structure CH.

The interlayer insulating films ILD may include channel side-edges facing the channel structure CH. The protrusion portions PP of the insulating structures IA may extend to cover the channel side-edges of the interlayer insulating films ILD.

Referring to FIGS. 2A to 2C, each of the protrusion portions PP of the insulating structures IA may extend from its connecting vertical part VP inside its corresponding gate electrode GA to cover a channel side-edge of the corresponding gate electrode GA. Each of the protrusion portions PP of the insulating structures IA may also extend in the horizontal direction beyond the interface of the corresponding interlayer insulating film ILD and its vertical part VP to form the groove R.

Each of the insulating structures IA may include a first material pattern M1A and a second material pattern M2A. The first material pattern M1A and the second material pattern M2A may be different from each other. The first material pattern M1A may be disposed between the corresponding interlayer insulating film ILD and channel structure CH. The first material pattern M1A may be disposed on the second material pattern M2A. For example, the first material pattern M1A may include at least one of a silicon oxynitride film (SiON), a silicon nitride film (SiN), and silicon (Si). The second material pattern M2A may be made of or include an oxide of the first material pattern M1A.

The memory film ML may include a tunnel insulating film TI, a data storage film DS, and a blocking insulating film BI which are stacked on the sidewall of the channel structure CH. The tunnel insulating film TI may surround the sidewall of the channel structure CH, the data storage film DS may surround a sidewall of the tunnel insulating film TI, and the blocking insulating film BI may surround a sidewall of the data storage film DS. The tunnel insulating film TI may be formed of a silicon oxide film capable of charge tunneling. The data storage film DS may be formed of a charge trap film, a material film including conductive nano dot, or a phase change material film. The data storage film DS may store data that is changed using Fowler-Nordheim tunneling. To this end, the data storage film DS may be formed of a silicon nitride film capable of charge trapping. The data storage film DS may store data based on an operation principle other than the Fowler-Nordheim tunneling. For example, the data storage film DS may be formed of a phase change material film and may store data corresponding to a phase change. The blocking insulating film BI may include an oxide film capable of charge blocking.

The channel structure CH may include a semiconductor film SE surrounded by the memory film ML. The semiconductor film SE may include silicon. In an embodiment, the semiconductor film SE may be formed to fill the center region of the hole H shown in FIG. 2A. In another embodiment, the semiconductor film SE may be formed to surround a core insulating film CO filling the center region of the hole H shown in FIG. 2A.

Referring to FIG. 2C, the second material pattern M2A may include the vertical portion VP and the protrusion portion PP. The vertical portion VP may extend from the first material pattern M1A toward the gate electrode GA and may be disposed between the corresponding interlayer insulating film ILD and memory film ML. The protrusion portion PP may extend from the vertical portion VP in the horizontal direction beyond the channel side-edge of the corresponding interlayer insulating film ILD in order to form the groove R. In the illustrated embodiment of FIG. 2C, the protrusion PP may have a first surface contacting the memory film ML, a second surface contacting the interlayer insulating film ILD and a third surface contacting the gate electrode GA. The protrusion PP may be wider than the vertical portion VP so that it may cover an edge of the interlayer insulating film ILD.

As shown in FIGS. 2A to 2C, the protrusion portions PP of each of the insulating structures IA may locally increase the thickness of the insulating structure at edges of the corresponding gate electrodes GA. Therefore, a fringing capacitance and a fringing field between the gate electrodes GA and the channel structure CH may be reduced by the protrusion portion PP. The data storage film DS may include a spacer region surrounded by the interlayer insulating films ILD and a cell region surrounded by the gate electrodes GA. When the fringing capacitance and the fringing field are reduced, concentration of holes accumulated in space regions of the data storage film DS during an erase operation of the semiconductor device may be reduced. In addition, a phenomenon in which electrons stored in the cell region of the data storage film DS are diffused to the space regions may be reduced.

Figure 3A:
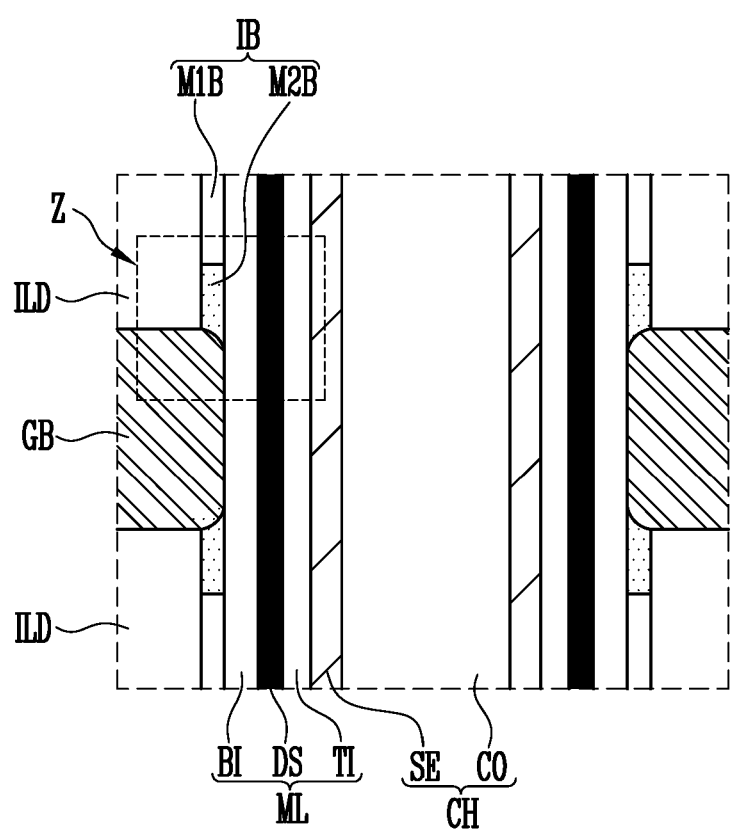
FIGS. 3A and 3B are views illustrating insulating structures according to an embodiment of the present disclosure.
Figure 3B:
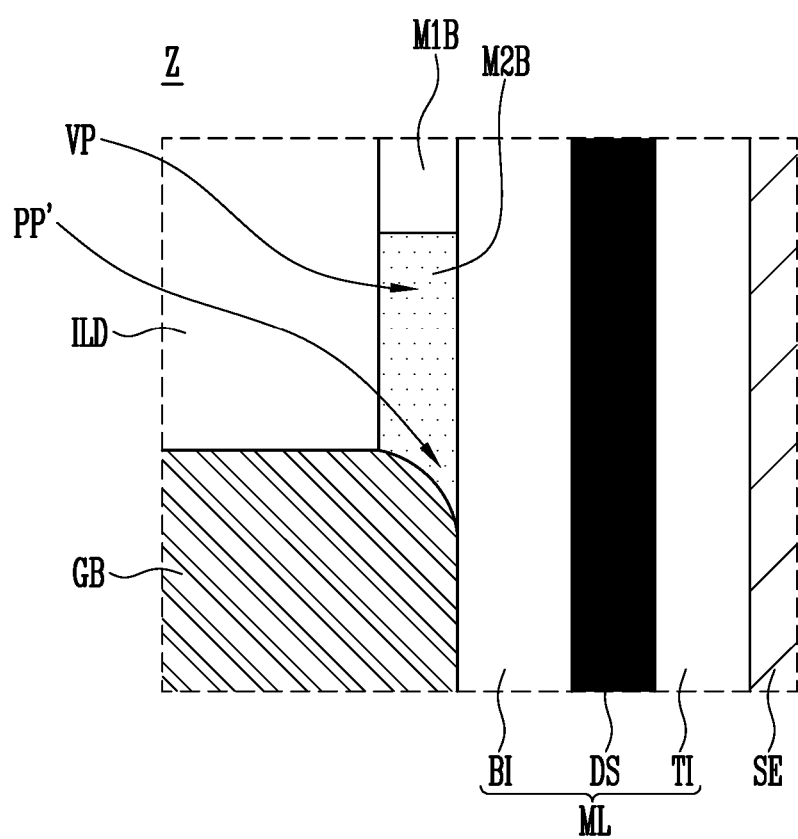

FIGS. 3A and 3B are views illustrating insulating structures according to an embodiment of the present disclosure. FIG. 3A is an enlarged view of a Z region shown in FIG. 3A.

Referring to FIGS. 3A and 3B, the insulating structures IB may be disposed apart from each other in the stack direction of the interlayer insulating films ILD and gate electrodes GB. The interlayer insulating films ILD and the gate electrodes GB may configure the gate stack body GST described above with reference to FIG. 1. The interlayer insulating films ILD may be formed of the same material as the interlayer insulating films ILD described above with reference to FIG. 1. The gate electrodes GB may be formed of the same material as the gate electrodes GA described above with reference to FIG. 1.

In FIG. 3A, one gate electrode GB is illustrated as being disposed between a pair of consecutive interlayer insulating films ILD which are adjacent to each other in the stack direction. The gate electrode GB may extend between the insulating structures IB adjacent to each other in the stack direction and may surround the memory film ML.

The memory film ML may be configured of the same structure and the same material films as those described above with reference to FIG. 1. For example, the memory film ML may surround the sidewall of the channel structure CH. The memory film ML may include the tunnel insulating film TI, the data storage film DS, and the blocking insulating film BI as described above with reference to FIG. 2B. The channel structure CH may be formed of the same structure and the same material films as those described above with reference to FIG. 2B. For example, the channel structure CH may be configured of the semiconductor film SE or may be configured of the core insulating film CO and the semiconductor film SE surrounding the core insulating film CO.

The insulating structures IB may include first material patterns M1B and second material patterns M2B. The first material patterns M1B of the insulating structures IB may surround the memory film ML and be spaced apart from each other in the stack direction. The first material pattern M1A may be disposed on the second material pattern M2A. The first and second material patterns M1A and M2A may be aligned to form a straight-line element.

The interlayer insulating films ILD may be formed to surround the first material patterns M1B, respectively. Each of the insulating films ILD may be longer than the corresponding first material pattern M1B in the stack direction.

The second material patterns M2B of the insulating structures IB may be disposed between the gate electrode GB and the first material patterns M1B adjacent to the gate electrode GB. A pair of a first material pattern MB1 and a second material pattern may be disposed between two consecutive gate electrodes GB. The second material patterns M2B may be configured of a different insulating material from that of the first material patterns M1B. In an embodiment, the first material patterns M1B may include a silicon oxynitride film (SiON), and the second material patterns M2B may include a porous insulating material. Hence, the second material patterns M2B may include many pores when compared to the first material patterns M1B and the blocking insulating film BI, and the second material patterns M2B may have a dielectric constant that is substantially lower than that of the first material patterns M1B and the blocking insulating film BI. Processes for forming porous insulating material are well known. The porous insulating material may be formed by using deposition method. For example, the porous insulating material may include porous silicon dioxide formed by using deposition method.

The second material patterns M2B may extend between each of the interlayer insulating films ILD and the memory film ML. Each of the second material patterns M2B may extend from the corresponding first material pattern M1B toward the gate electrode GB.

The second material pattern M2B may include a vertical portion VP and a protrusion portion PP'. The vertical portion VP may extend from the first material pattern M1B toward the gate electrode GB and may be disposed between the corresponding interlayer insulating film ILD and the memory film ML. The protrusion portion PP' may extend from the vertical portion VP. In the illustrated embodiment of FIG. 3B, the protrusion portion PP' may have a first surface contacting the memory film ML and a second surface contacting the gate electrode GB. The second surface may contact the corresponding gate electrode GB which may have a corner having a convex surface which is complementary to the concave surface of the second surface of the protrusion portion PP'. The protrusion portion PP'' may have the same width as the vertical portion VP.

As shown in FIGS. 3A and 3B, the second material pattern M2B of each of the insulating structures IB may locally reduce a dielectric constant at an edge of the corresponding gate electrode GB. Therefore, a fringing capacitance and a fringing field between the gate electrode GB and the channel structure CH may be reduced by the second material pattern M2B. As a result, the concentration of holes accumulated in the space regions of the data storage film DS during the erase operation may be reduced. The phenomenon that the electrons stored in the cell region of the data storage film DS are diffused into the space regions may be reduced.

Figure 4A:
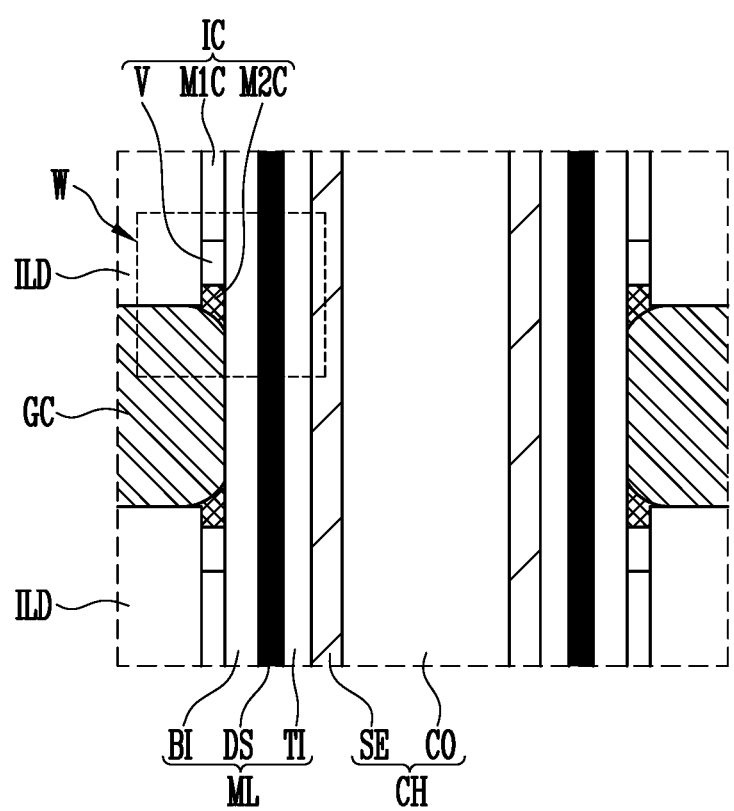
FIGS. 4A and 4B are views illustrating insulating structures according to an embodiment of the present disclosure.
Figure 4B:
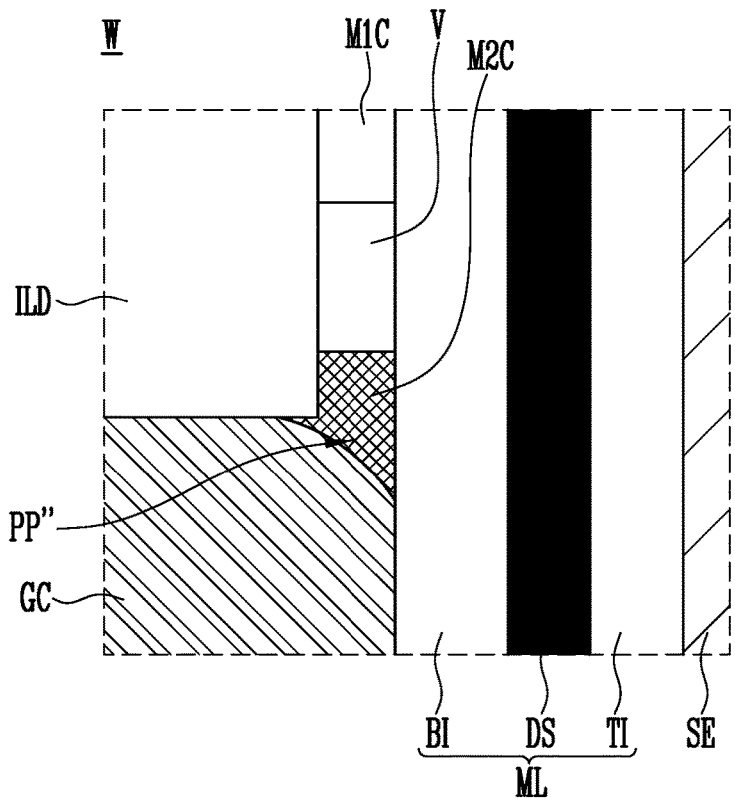

FIGS. 4A and 4B are views illustrating insulating structures IC according to an embodiment of the present disclosure. FIG. 4B is an enlarged view of a region W shown in FIG. 4A.

Referring to FIGS. 4A and 4B, the insulating structures IC may be disposed apart from each other in the stack direction of the interlayer insulating films ILD and gate electrodes GC. The interlayer insulating films ILD and the gate electrodes GC may configure the gate stack body GST described above with reference to FIG. 1. The interlayer insulating films ILD may be formed of the same material as the interlayer insulating films ILD described above with reference to FIG. 1. The gate electrodes GC may be formed of the same material as the gate electrodes GA described above with reference to FIG. 1.

The insulating structures IC may be formed along the stack direction of the interlayer insulating films ILD and the gate electrodes GC, and may alternate with the gate electrodes GC in the stack direction. FIG. 4A shows gate electrode GC which is disposed between two consecutive interlayer insulating films ILD adjacent to each other in the stack direction. The gate electrode GC may surround the memory film ML.

The memory film ML may be configured of the same structure and the same material film as those described above with reference to FIG. 1. For example, the memory film ML may surround the sidewall of the channel structure CH. The memory film ML may include the tunnel insulating film TI, the data storage film DS, and the blocking insulating film BI as described above with reference to FIG. 2B. The channel structure CH may be formed of the same structure and the same material films as those described above with reference to FIG. 2B. For example, the channel structure CH may be configured of the semiconductor film SE or may be configured of the core insulating film CO and the semiconductor film SE surrounding the core insulating film CO.

The insulating structures IC may include first material patterns M1C and second material patterns M2C. The first material patterns M1C of the insulating structures IC may surround the memory film ML and be spaced apart from each other in the stack direction.

The interlayer insulating films ILD may be formed to surround the first material patterns M1C, respectively. Each of the interlayer insulating films ILD may be longer than the corresponding first material pattern M1C in the stack direction. Each of the insulating structures IC may protrude in the stack direction toward the corresponding gate electrodes GC.

Each of the second material patterns M2C of the insulating structures IC may be disposed between the corresponding gate electrode GC and the corresponding first material pattern M1C. The second material patterns M2C may include protrusion portions PP'" extending between the gate electrode GC and the interlayer insulating films ILD so as to cover the channel side-edges of the interlayer insulating films ILD facing the channel structure CH. Each of the protrusion portions PP'" may be disposed between the gate electrode GC and the memory film ML. The protruding portions PP'" extend to overlap partially in the stack direction with the corresponding interlayer insulating film ILD.

The second material patterns M2C may be configured of an insulating material. The second material patterns M2C may be spaced apart from the first material patterns M1C and a void V may be formed between the first material pattern M1C and the second material pattern M2C which are adjacent to each other. The void V may be disposed between each of the interlayer insulating films ILD and the memory film ML. The voids V may be spaced from the gate electrode GC by the second material patterns M2C that are in contact with the interlayer insulating films ILD.

As shown in FIGS. 4A and 4B, a dielectric constant of the insulating structures IC may be locally reduced through the void V at an edge of the gate electrode GC. Therefore, a fringing capacitance and a fringing field between the gate electrode GC and the channel structure CH may be reduced by the void V. As a result, the concentration of holes accumulated in the space regions of the data storage film DS during the erase operation may be reduced. The phenomenon that the electrons stored in the cell region of the data storage film DS are diffused into the space regions may be reduced.

FIGS. 5A to 5F are cross-sectional views illustrating a method of manufacturing a semiconductor device according to an embodiment of the present disclosure. For example, FIGS. 5A to 5F are cross-sectional views illustrating a method of manufacturing a semiconductor device including the insulating structures shown in FIGS. 2A to 2C.

Figure 5A:
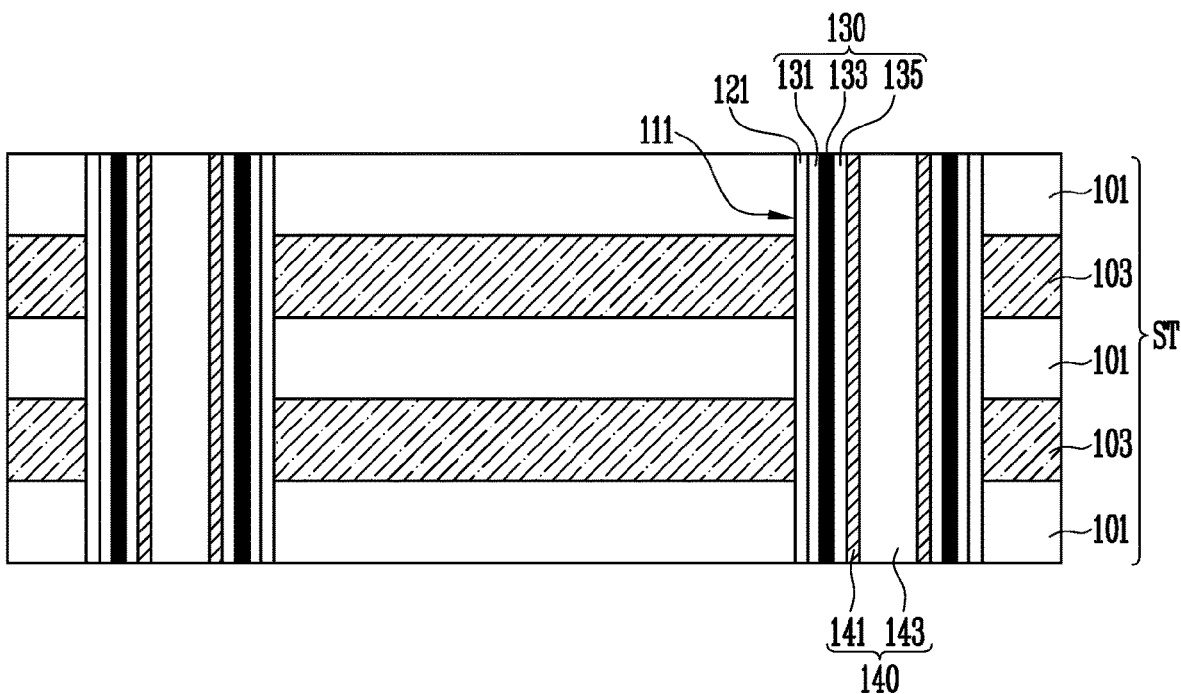
FIGS. 5A to 5F are cross-sectional views illustrating a method of manufacturing a semiconductor device according to an embodiment of the present disclosure.

Referring to FIG. 5A, a stack body ST in which interlayer insulating films 101 and sacrificial films 103 are alternately stacked may be formed. The stack body ST may be formed on a substrate (not shown) including a peripheral circuit.

The sacrificial films 103 may be formed of a material different from that of the interlayer insulating films 101. For example, the interlayer insulating films 101 may be formed of an oxide such as a silicon oxide film. The sacrificial films 103 may be formed of a material having an etch rate different from that of the interlayer insulating films 101. For example, the sacrificial films 103 may be formed of a nitride such as a silicon nitride film.

Subsequently, forming a hole 111 penetrating the stack body ST, forming a first material film 121 on an inner wall of the hole 111, forming a memory film 130 on the first material film 121, and forming a channel structure 140 in a center region of the hole 111 opened by the memory film 130 may be sequentially performed.

The first material film 121 may include at least one of a silicon oxynitride film (SiON), a silicon nitride film (SiN), and a silicon film (Si).

The memory film 130 may include a blocking insulating film 131, a data storage film 133 and, a tunnel insulating film 135 which are sequentially stacked on the first material film 121 toward the center region of the hole 111. The blocking insulating film 131 may include an oxide film capable of charge blocking. The data storage film 133 may be formed of a charge trap film, a material film including conductive nano dot, or a phase change material film. For example, the data storage film 133 may store data that is changed using Fowler-Nordheim tunneling. To this end, the data storage film 133 may be formed of a silicon nitride film capable of charge trapping. The tunnel insulating film 135 may be formed of a silicon oxide film capable of charge tunneling.

The channel structure 140 may include a semiconductor film 141 formed on the memory film 130. The semiconductor film 141 may include silicon. When the center region of the hole 111 is opened by the semiconductor film 141, the center region of the hole 111 may be filled with a core insulating film 143.

Figure 5B:
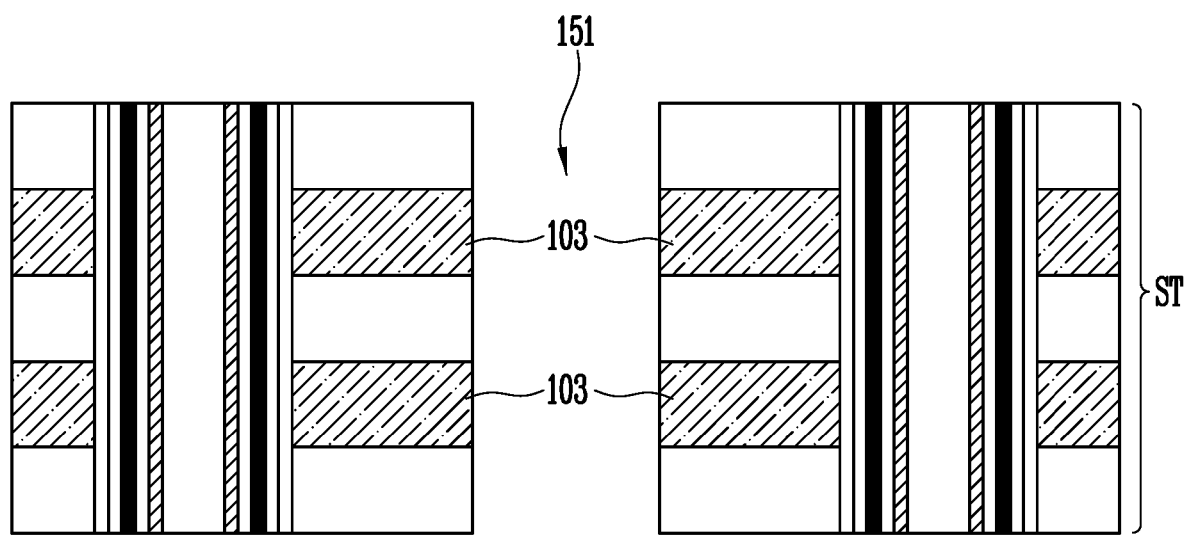

Referring to FIG. 5B, a slit 151 penetrating the stack body ST may be formed. The sacrificial films 103 may be exposed by the slit 151.

Figure 5C:
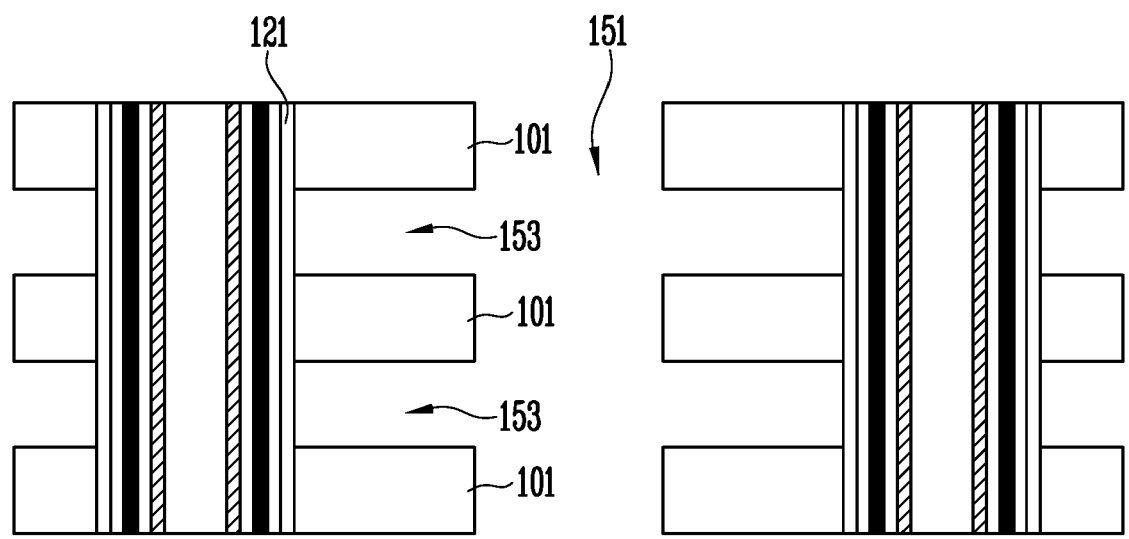

Referring to FIG. 5C, the sacrificial film 103 shown in FIG. 5B may be removed through the slit 151. Therefore, first opening portions 153 exposing a side portion of the first material film 121 may be formed. The first opening portions 153 may be defined between the interlayer insulating films 101.

Figure 5D:
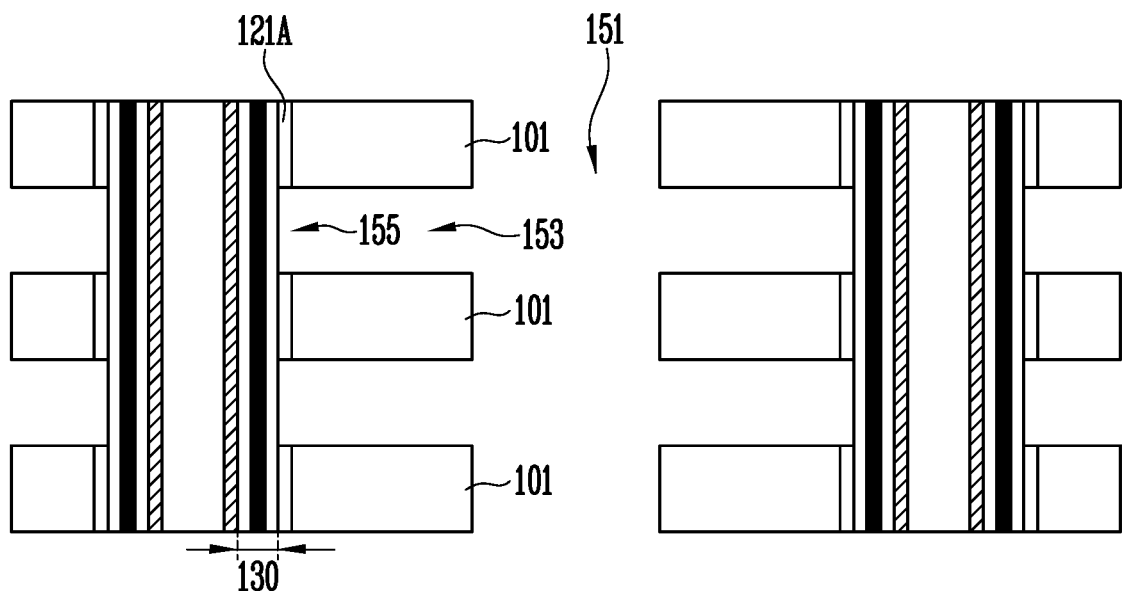

Referring to FIG. 5D, the exposed regions of the first material film 121 may be etched through the first opening portions 153 to form second opening portions 155 connected to the first opening portions 153, respectively. Some regions of the first material film 121 surrounded by the interlayer insulating films 101 may remain as first material patterns 121A. The first material patterns 121A may be separated from each other by the second opening portions 155.

Figure 5E:
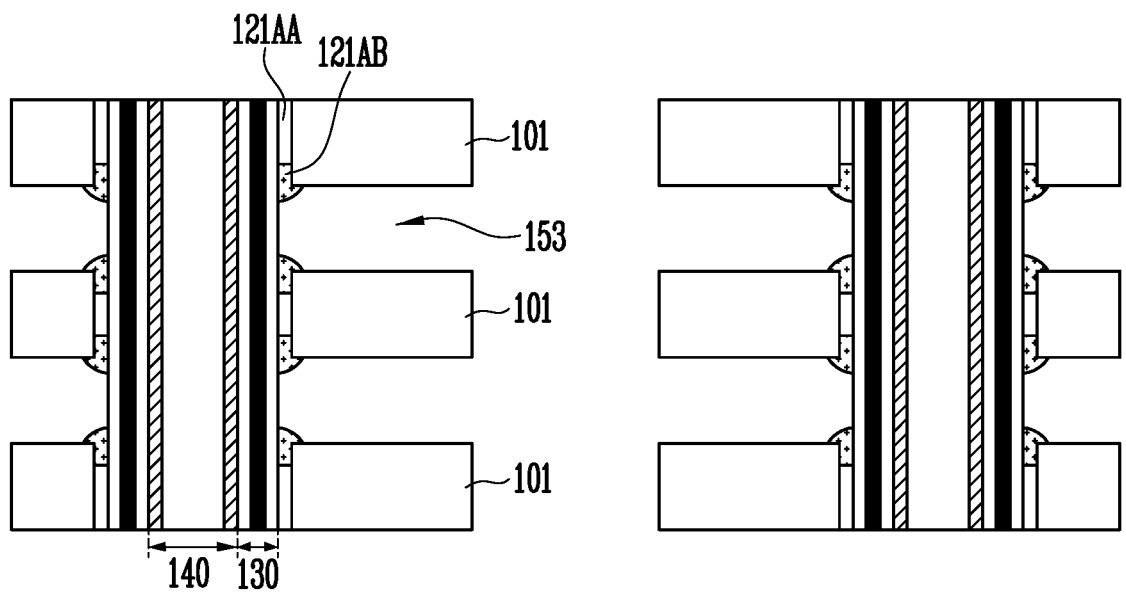

Referring to FIG. 5E, the first material patterns 121A may be partially oxidized from an etched surface of each of the first material patterns 121A shown in FIG. 5D through the second opening portions 155 described above with reference to FIG. 5D. Therefore, second material patterns 121AB configured of the oxide of the first material film may be formed. First material patterns 121AA which are not oxidized may remain between each of the interlayer insulating films 101 and the memory film 130.

In an embodiment, an oxidation process may be performed in a thermal oxidation method. The second material patterns 121AB may include an oxide formed by an evaporation method other than the thermal oxidation method.

The second material patterns 121AB may extend to cover channel side-edges of the interlayer insulating films 101 facing the channel structure 140.

Figure 5F:
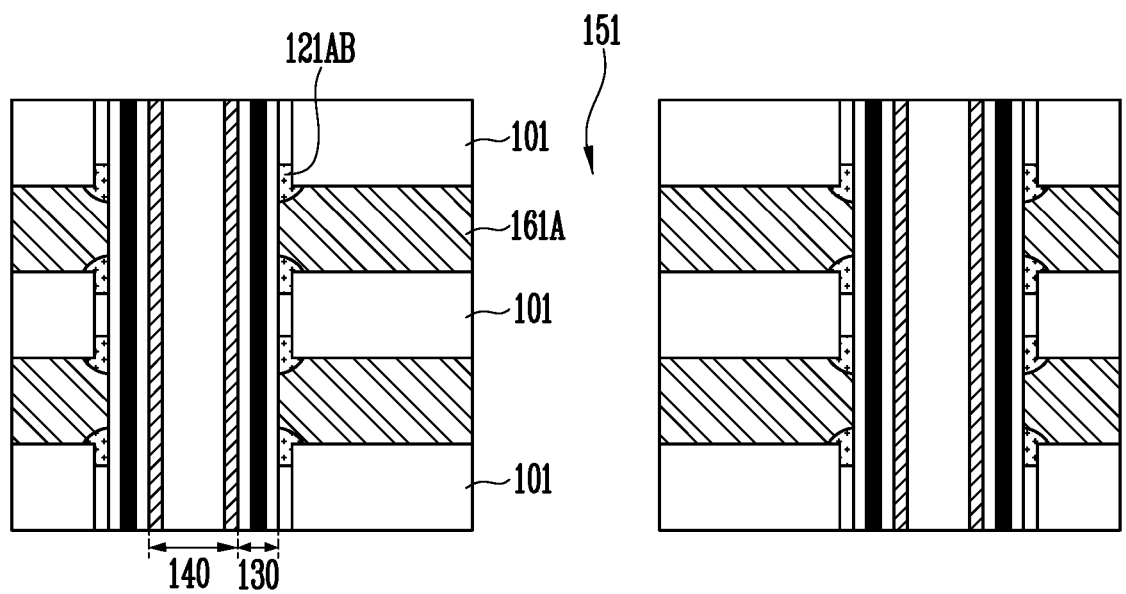

Referring to FIG. 5F, the first opening portions 153 shown in FIG. 5E may be filled with gate electrodes 161A. The forming the gate electrodes 161A may include depositing a conductive material to fill the first opening portions 153 and removing the conductive material in the slit 151 so that the conductive material is separated into the gate electrodes 161A by the slit 151.

The gate electrodes 161A may extend to fill between the second material patterns 121AB adjacent to each other in a direction in which the gate electrodes 161A and the interlayer insulating films 101 are stacked. Therefore, the gate electrodes 161A may include recessed portions having a shape corresponding to the second material patterns 121AB.

Figure 6A:
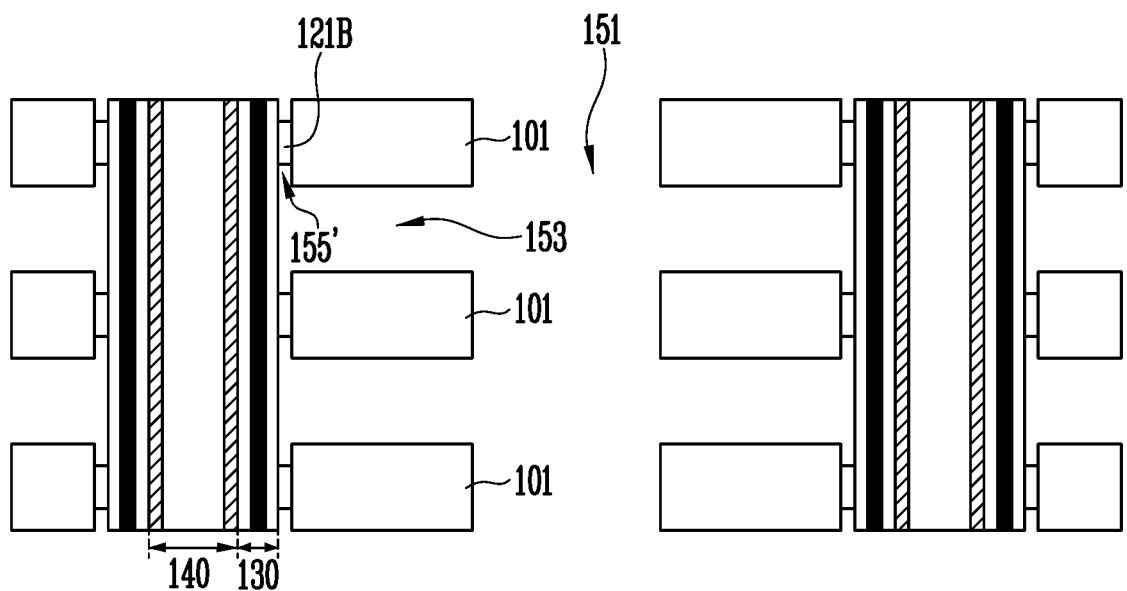
FIGS. 6A to 6C are cross-sectional views illustrating a method of manufacturing a semiconductor device according to an embodiment of the present disclosure.
Figure 6B:
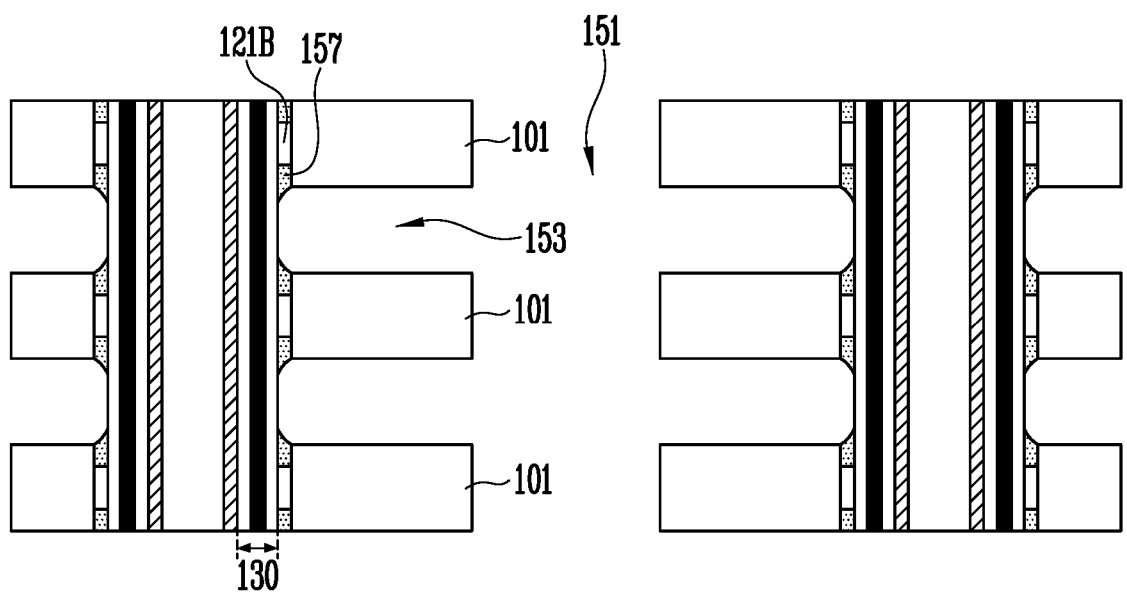
Figure 6C:
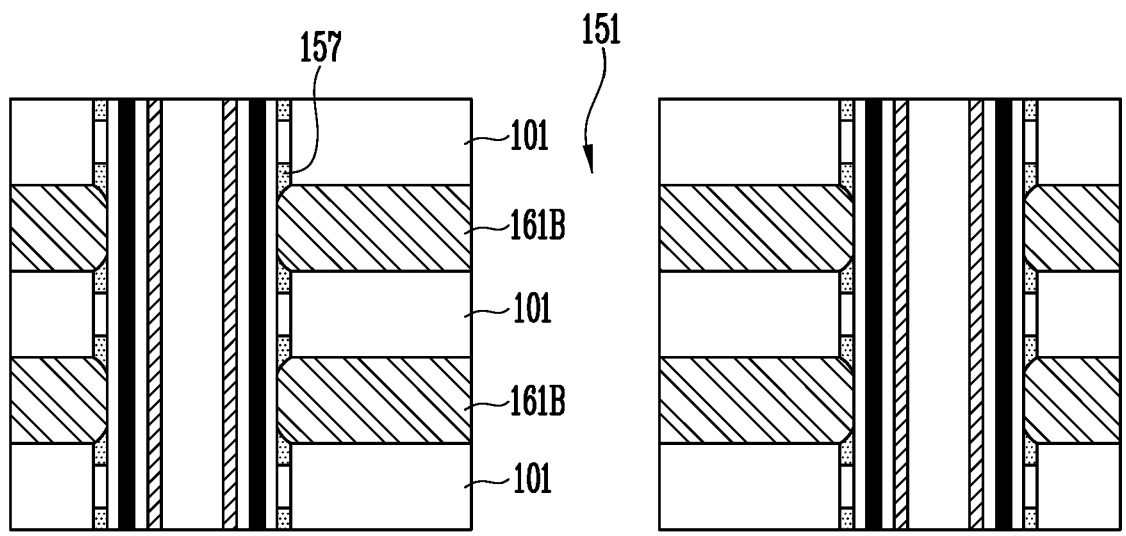

FIGS. 6A to 6C are cross-sectional views illustrating a method of manufacturing a semiconductor device according to an embodiment of the present disclosure. For example, FIGS. 6A to 6C are cross-sectional views illustrating a method of manufacturing a semiconductor device including the insulating structures shown in FIGS. 3A and 3B.

Before a process shown in FIG. 6A is performed, the same processes as those described above with reference to FIGS. 5A to 5C may be performed.

Referring to FIG. 6A, the exposed portions of the first material film are etched through the first opening portions 153 shown in FIG. 5C to form second opening portions 155' connected to the first opening portions 153, respectively.

The first material film may be separated into the first material patterns 121B by the second opening portions 155'.

The first material patterns 121B may be or include a silicon oxynitride film (SiON). The first material patterns 121B may remain between the interlayer insulating films 101 and the memory film 130. The second opening portions 155' may extend between the memory film 130 and the interlayer insulating films 101 to expose the channel side-edges of the interlayer insulating films 101 facing the channel film 140.

Referring to FIG. 6B, second material patterns 157 may be formed in the second opening portions 155' described above with reference to FIG. 6A. The second material patterns 157 may be formed of a different insulating material from that of the first material patterns 121B. In an embodiment, the second material patterns 157 may include an insulating material having a dielectric constant lower than that of the first material patterns 121B. For example, the second material patterns 157 may include a porous insulating material.

The forming the second material patterns 157 may include forming a second material film on the first opening portions 153 so that the second opening portions 155' shown in FIG. 6A are filled, and etching the second material film so that the second material film is separated into the second material patterns 157. The second material film may be formed using at least one of a thermal oxidation method and a deposition method. Some regions of the memory film 130 may be exposed between the second material patterns 157.

Referring to FIG. 6C, the first opening portions 153 shown in FIG. 6B may be filled with the gate electrodes 161B. Forming the gate electrodes 161B may be performed as described above with reference to FIG. 5F.

The gate electrodes 161B may extend to fill between the second material patterns 157 adjacent to each other in a direction in which the gate electrodes 161B and the interlayer insulating films 101 are stacked.

Figure 7A:
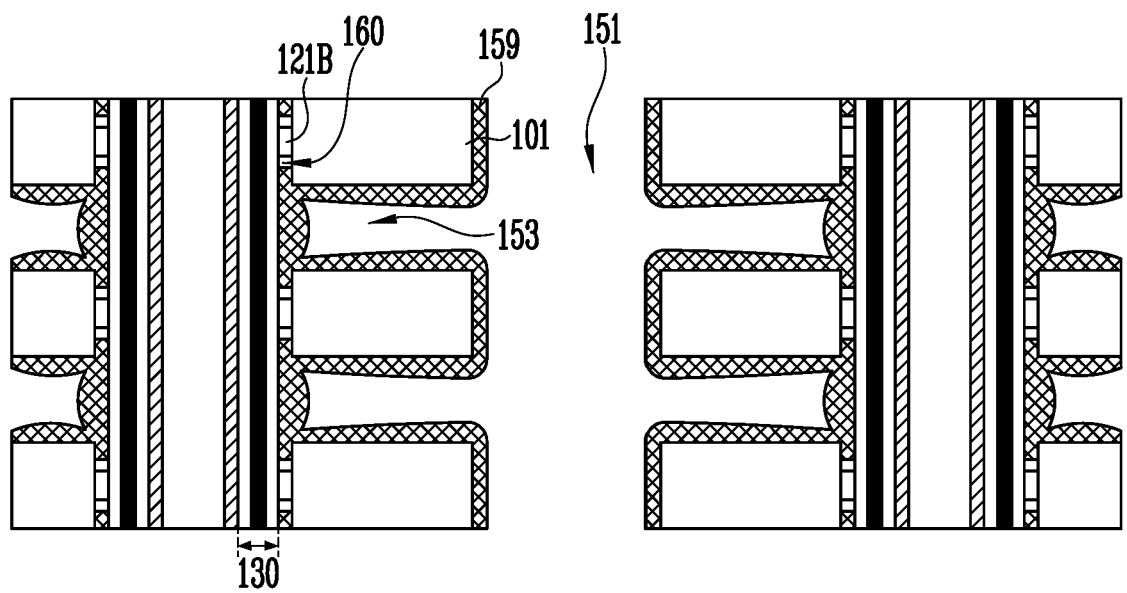
FIGS. 7A and 7B are cross-sectional views illustrating a method of manufacturing a semiconductor device according to an embodiment of the present disclosure.
Figure 7B:
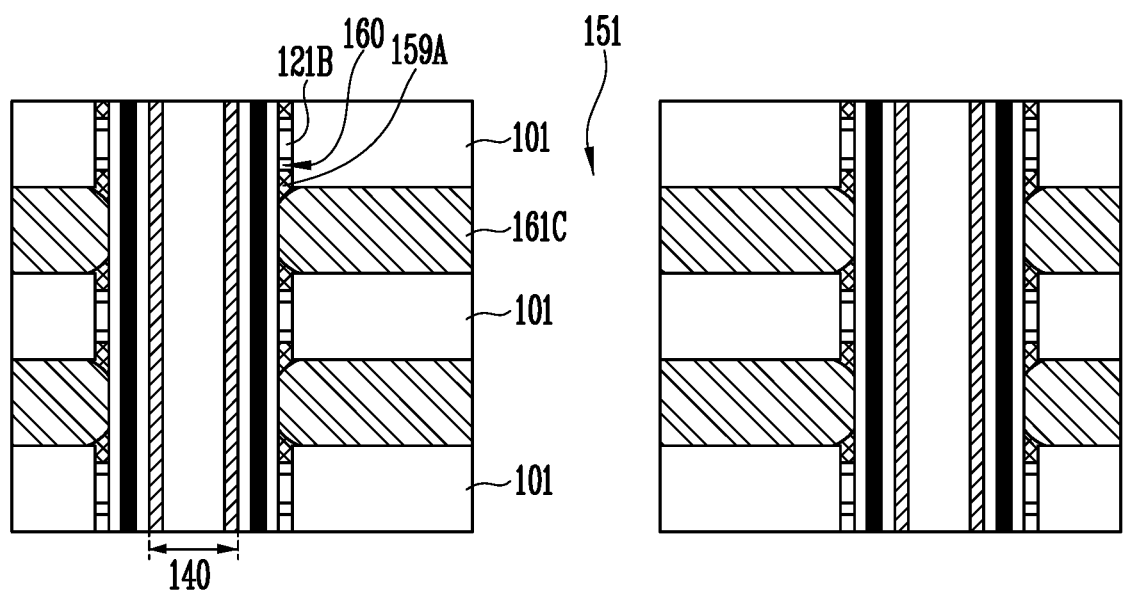

FIGS. 7A and 7B are cross-sectional views illustrating a method of manufacturing a semiconductor device according to an embodiment of the present disclosure. For example, FIGS. 7A and 7B are cross-sectional views illustrating a method of manufacturing a semiconductor device including the insulating structures shown in FIGS. 4A and 4B.

Before a process shown in FIG. 7A is performed, the same processes as those described above with reference to FIGS. 5A to 5C may be performed. Subsequently, the same processes as those described above with reference to FIG. 6A may be performed.

Referring to FIG. 7A, a second material film 159 may be deposited along surfaces of the interlayer insulating layers 101 exposed through the first opening portions 153 and the slit 151 so that a void 160 may be formed in the second opening portions 155'. The second material film 159 may be formed using a deposition method having a low step coverage so that the void 160 is formed between the interlayer insulating layers 101 and the memory film 130. For example, the second material film 159 may be formed using a chemical vapor deposition method or a physical vapor deposition method. The second material film 159 may be or include an oxide film.

Referring to FIG. 7B, the second material film 159 shown in FIG. 7A may be etched so that second material patterns 159A remain on the channel side-edges of the interlayer insulating films 101 facing the channel structure 140. Subsequently, the first opening portions 153 shown in FIG. 7A may be filled with gate electrodes 161C. Forming the gate electrodes 161C may be performed the same as described above with reference to FIG. 5F. The gate electrodes 161C may be spaced apart from the void 160 by the second material patterns 159A remaining on the channel side-edges of the interlayer insulating films 101.

FIGS. 8A to 8E are perspective views schematically illustrating memory strings of semiconductor devices according to embodiments of the present disclosure. For ease of recognition, interlayer insulating films are not shown in FIGS. 8A to 8E. A first direction I shown in FIGS. 8A to 8E is defined as the stack direction described above with reference to FIGS. 1, 2A to 2C, 3A, 3B, 4A, and 4B. A second direction II and a third direction III shown in FIGS. 8A to 8E are defined as directions intersecting with each other in a plane perpendicular to the first direction I.

Referring to FIGS. 8A to 8E, each of the memory strings CST may include gate electrodes CP1 to CPn (n is a natural number) disposed under bit lines BL and a channel structure CH penetrating at least some of the gate electrodes CP1 to CPn. The gate electrodes CP1 to CPn may be penetrated by a first slit SI1. The bit lines BL may extend in the second direction II and may be spaced apart from each other in the third direction III.

One end of the channel structure CH may be connected to a corresponding bit line via a bit line contact plug BCT. The gate electrodes CP1 to CPn may include at least one of the gate electrodes GA, GB, and GC described above with reference to FIGS. 1, 2A to 2C, 3A, 3B, 4A, and 4B.

The gate electrodes CP1 to CPn may be spaced apart from each other along an extension direction of the channel structure CH. For example, the gate electrodes CP1 to CPn may be disposed from the first to n-th layers that are sequentially arranged in the first direction I and are spaced apart from each other. The first layer is defined as a layer disposed farthest from the bit lines BL among the gate electrodes CP1 to CPn and the n-th layer is defined as a layer disposed closest to the bit lines BL among the gate electrodes. Each of the gate electrodes CP1 to CPn may extend in the third direction III.

Referring to FIGS. 8A to 8D, the n-th patterns CPn disposed in at least the n-th layer among the gate electrodes CP1 to CPn may be used as the drain select lines DSL. The present disclosure is not limited thereto. For example, not only the n-th patterns CPn disposed in the n-th layer are used as the drain select lines DSL but also the (n−1)-th patterns CPn−1 disposed in the (n−1)-th layer may be used as other drain select lines DSL.

The first pattern CP1 disposed in at least the first layer among the gate electrodes CP1 to CPn may be used as the source select line SSL. The present disclosure is not limited thereto. For example, the first pattern CP1 disposed in the first layer and the second pattern CP2 disposed in the second layer may be used as the source select line SSL.

The gate electrodes (for example, CP3 to CPn−2) disposed between the drain select lines DSL and the source select lines SSL may be used as the word lines WL.

The drain select lines DSL disposed in the same layer may be separated from each other by a second slit SI2 overlapped the word lines WL.

Figure 8A:
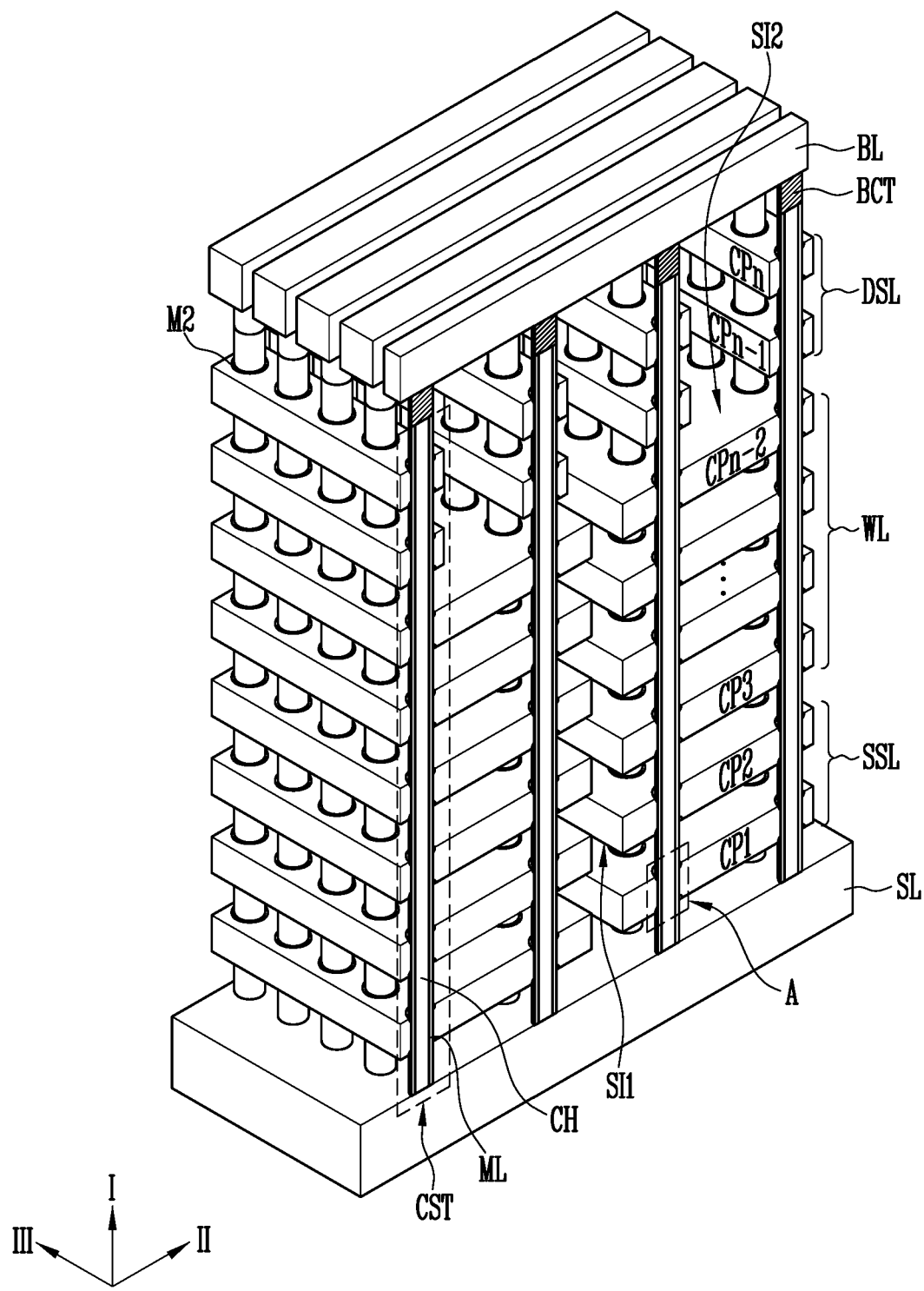
FIGS. 8A to 8E are perspective views schematically illustrating memory strings of semiconductor devices according to embodiments of the present disclosure.
Figure 8B:
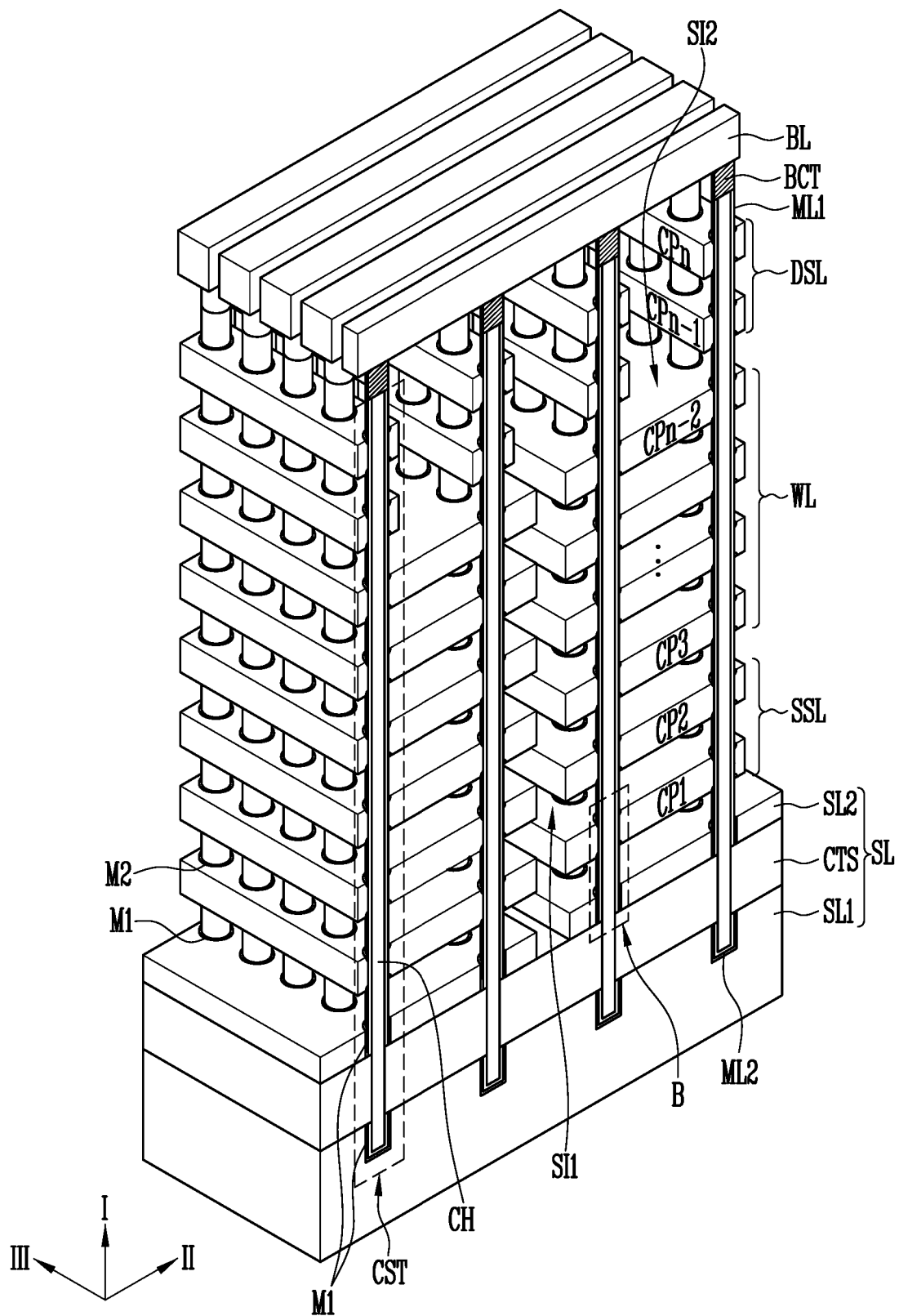
Figure 8C:
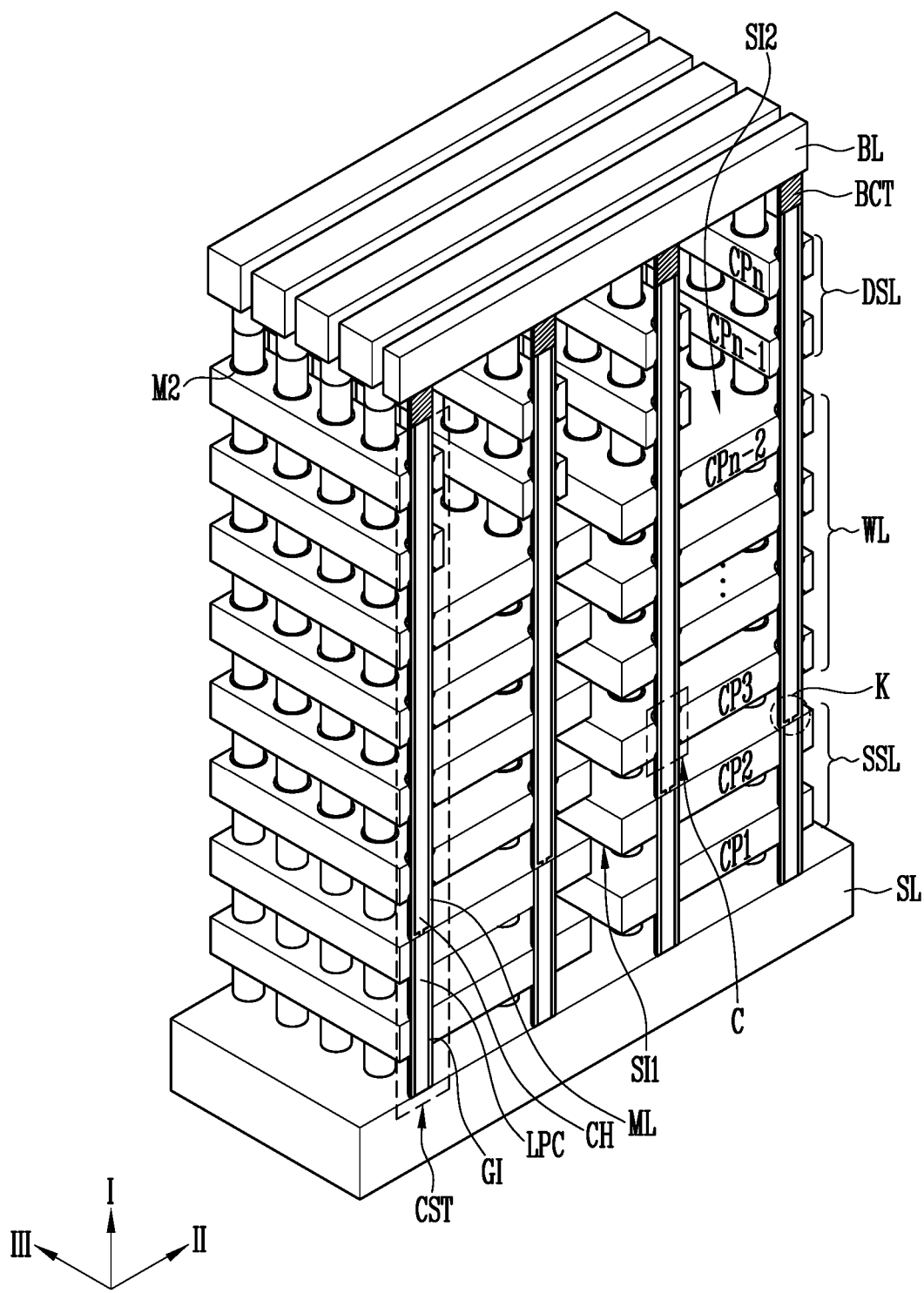
Figure 8D:
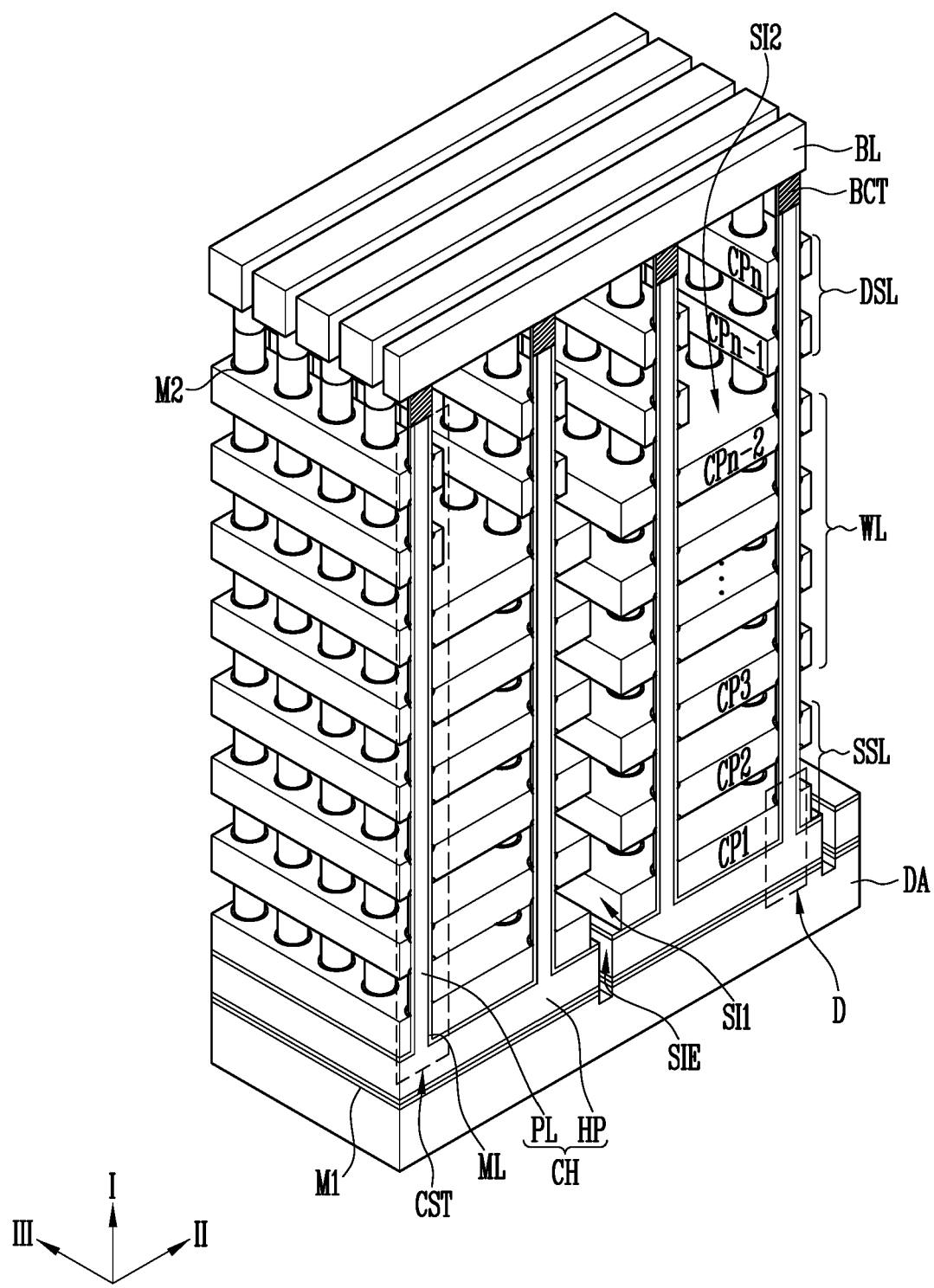
Figure 8E:
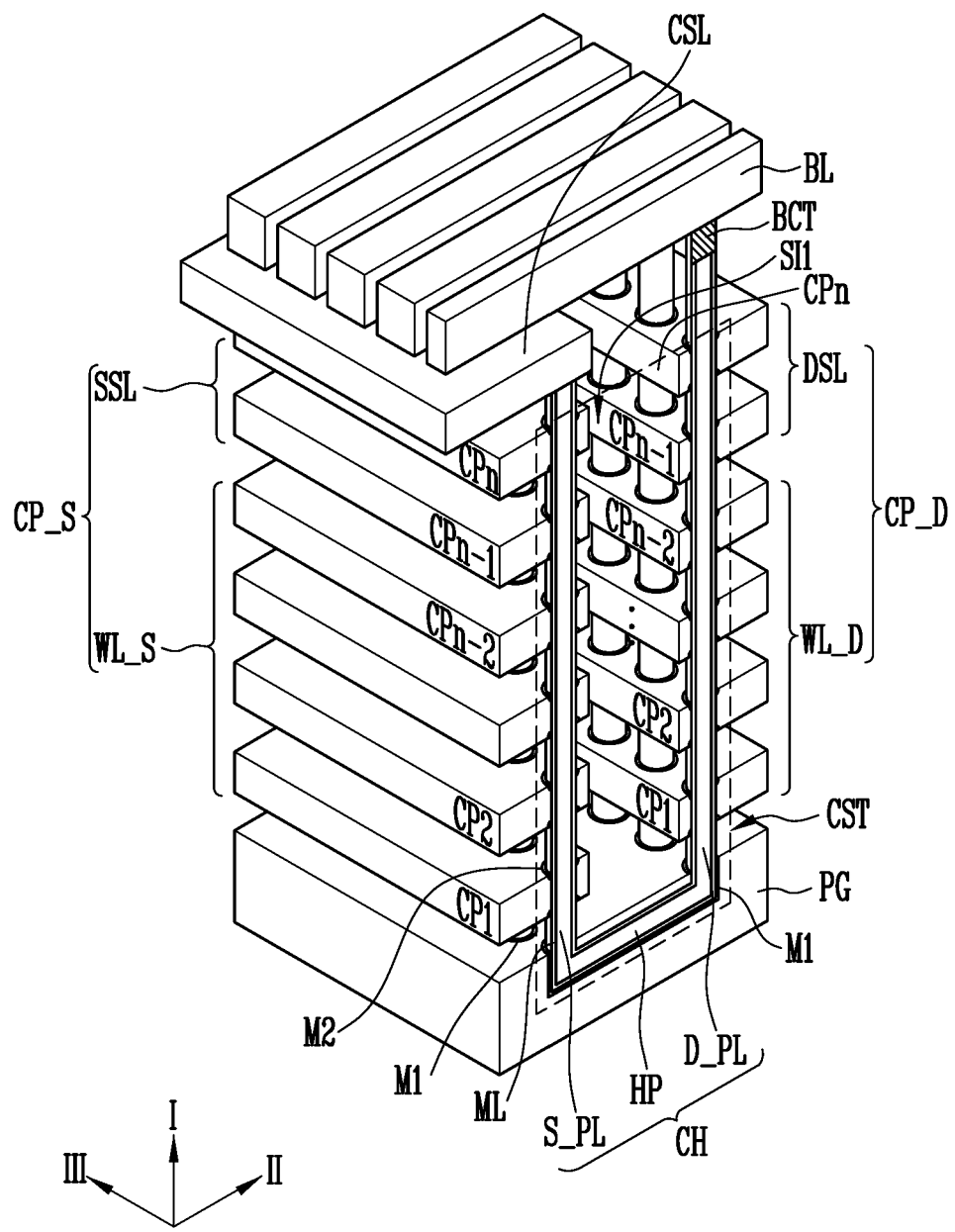

As another example, referring to FIG. 8E, the gate electrodes CP1 to CPn may be separated into a source side stack body CP_S and a drain side stack body CP_D by the slit SI1.

The n-th patterns CPn disposed in at least the n-th layer among the gate electrodes CP1 to CPn may be used as the drain select line DSL and the source select line SSL. The present disclosure is not limited thereto. For example, not only the n-th patterns CPn disposed in the n-th layer are used as the drain select line DSL and the source select line SSL, but also the (n−1)-th patterns CPn−1 disposed in the (n−1)-th layer may be used as another drain select line DSL and another source select line SSL. The source select lines SSL are included in the source side stack body CP_S and the drain select lines DSL are included in the drain side stack body CP_D.

The gate electrodes (for example, CP1 to CPn−2) included in the drain side stack body CP_D and disposed under the drain select lines DSL may be used as drain side word lines WL_D. The gate electrodes (for example, CP1 to CPn−2) included in the source side stack body CP_S and disposed under the source select lines SSL may be used as source side word lines WL_S.

Referring to FIGS. 8A to 8E again, the source select lines SSL may be used as gates of the source select transistors. The word lines WL, the drain side word lines WL_D, and the source side word lines WL_S may be used as gates of the memory cells. The drain select lines DSL may be used as gates of the drain select transistors.

Each of the memory strings CST may include at least one source select transistor, memory cells connected in series to the source select transistor, and at least one drain select transistor connected in series to the memory cells. The channel structure CH may be formed in various structures to connect the memory cells in series.

FIGS. 9A to 9E are enlarged views illustrating portions of the memory strings shown in FIGS. 8A to 8E.

Figure 9A:
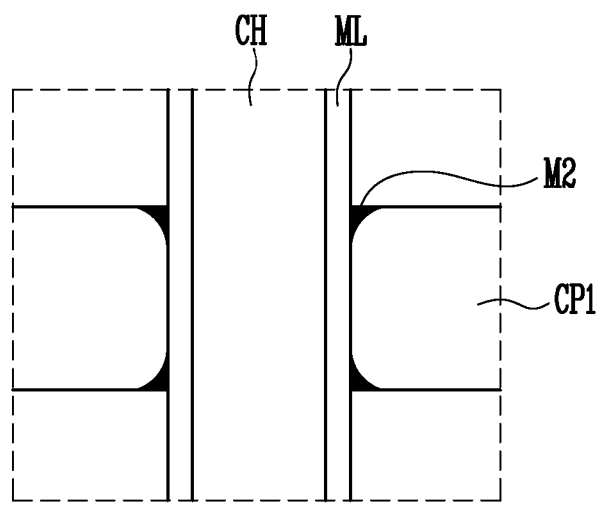
FIGS. 9A to 9E are enlarged views illustrating portions of the memory strings shown in FIGS. 8A to 8E.

FIG. 9A is an enlarged view of an A region shown in FIG. 8A.

Referring to FIGS. 8A and 9A, the channel structure CH may penetrate the drain select lines DSL, the word lines WL, and the source select lines SSL and may be in direct contact with a source film SL disposed under the gate electrodes CP1 to CPn.

The source film SL may be in contact with a bottom surface of the channel structure CH. The source film SL may be formed of a doped semiconductor film including a source dopant. The source dopant may include an n-type impurity. For example, the source film SL may include n-type doped silicon.

The sidewall of the channel structure CH may be surrounded by the memory film ML. The memory film ML may extend along the sidewall of the channel structure CH to open an upper surface and a bottom surface of the channel structure CH.

Each of the gate electrodes CP1 to CPn may include edges facing the memory film ML. Each of the edges may be covered with a material film M2 of an insulating structure. The material film M2 of the insulating structure may be the second material pattern M2A of the insulating structure IA described above with reference to FIGS. 2A to 2C, may be the second material pattern M2B of the insulating structure IB described above with reference to FIGS. 3A and 3B, or may be the second material pattern M2C of the insulating structure IC described above with reference to FIGS. 4A and 4B.

Figure 9B:
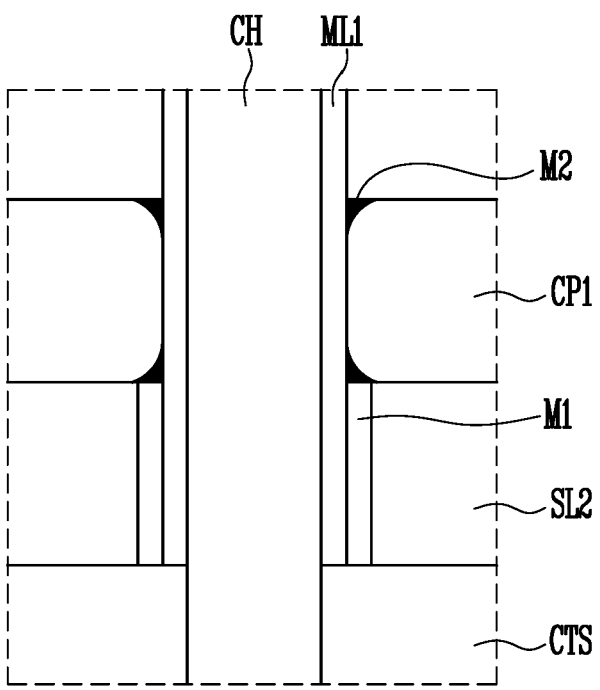

FIG. 9B is an enlarged view of a B region shown in FIG. 8B.

Referring to FIGS. 8B and 9B, the channel structure CH may penetrate the drain select lines DSL, the word lines WL, and the source select lines SSL, and may extend into the source film SL disposed under the gate electrodes CP1 to CPn.

The source film SL may include a first source film SL1, a contact source film CTS, and a second source film SL2. The channel structure CH may penetrate the second source film SL2 and the contact source film CTS and may extend into the first source film SL1.

The first source film SL1 may surround a lower end of the channel structure CH. The first source film SL1 may be formed of a doped semiconductor film including a source dopant. The source dopant may include an n-type impurity. For example, the first source film SL1 may include n-type doped silicon.

The contact source film CTS may be disposed on the first source film SL1 and may be in contact with an upper surface of the first source film SL1. The contact source film CTS may protrude more toward the channel structure CH than the first source film SL1 and the second source film SL2, and may be in direct contact with the sidewall of the channel structure CH. The contact source film CTS surrounds the channel structure CH.

The second source film SL2 may be disposed between the contact source film CTS and the source select lines SSL. The second source film SL2 may be omitted in some cases.

Each of the contact source film CTS and the second source film SL2 may be formed of a doped semiconductor film including a source dopant. The source dopant may include an n-type impurity. For example, each of the contact source film CTS and the second source film SL2 may include n-type doped silicon.

An upper end sidewall of the channel structure CH protruding toward the bit line BL may be surrounded by a first memory film ML1. A second memory film ML2 may be disposed between the channel structure CH and the first source film SL1. The first memory film ML1 and the second memory film ML2 may be separated from each other by the contact source film CTS.

A first material pattern M1 of an insulating structure may be disposed between the first source film SL1 and the second memory film ML2, and between the second source film SL2 and the first memory film ML1. The gate electrodes CP1 to CPn may include edges facing the first memory film ML1. Each of the edges may be covered with a second material pattern M2 of an insulating structure. The first material pattern M1 may be the same material as the first material pattern M1A of the insulating structure IA described above with reference to FIGS. 2A to 2C, may be the same material as the first material pattern M1B of the insulating structure IB described above with reference to FIGS. 3A and 3B, or may be the same material as the first material pattern M1C of the insulating structure IC described above with reference to FIGS. 4A and 4B. The second material pattern M2 may be the second material pattern M2A of the insulating structure IA described above with reference to FIGS. 2A to 2C, may be the second material pattern M2B of the insulating structure IB described above with reference to FIGS. 3A and 3B, or may be the second material pattern M2C of the insulating structure IC described above with reference to FIGS. 4A and 4B.

Referring to FIG. 8C, the channel structure CH may penetrate the drain select lines DSL and the word lines WL. The channel structure CH may be connected to a lower channel structure LPC penetrating the source select lines SSL.

Figure 9C:
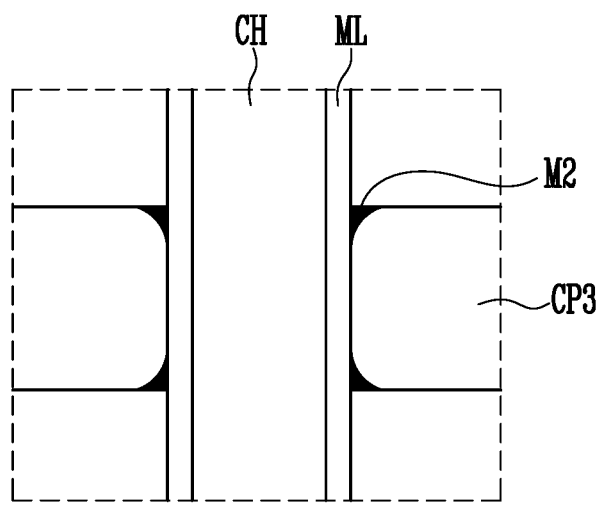
Figure 10:
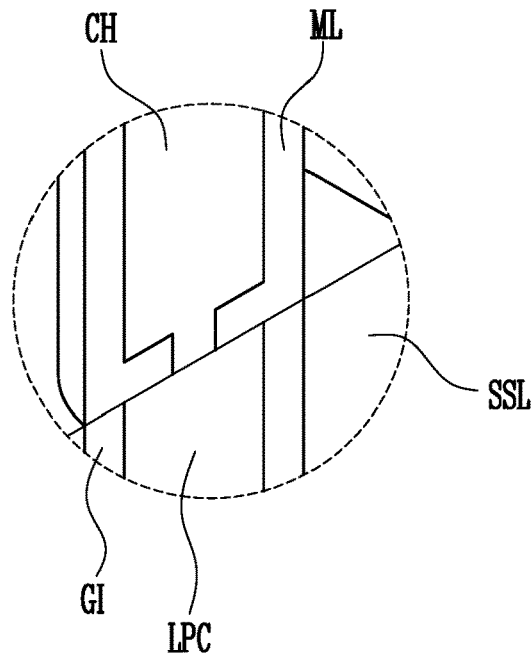
FIG. 10 is an enlarged view of a K region shown in FIG. 8C.

FIG. 9C is an enlarged view of a C region shown in FIG. 8C. FIG. 10 is an enlarged view of a K region shown in FIG. 8C.

Referring to FIGS. 8C, 9C, and 10, the lower channel structure LPC is connected to a portion under the corresponding channel structure CH. The lower channel structure LPC may include a doped semiconductor film. For example, the lower channel structure LPC may include n-type doped silicon. The channel structure CH may be surrounded by the memory film ML. The memory film ML may extend along the sidewall of the channel structure CH to open the upper surface and the bottom surface of the channel structure CH. The sidewall of the lower channel structure LPC may be surrounded by a gate insulating film GI. The gate insulating film GI may extend along the sidewall of the lower channel structure LPC to open an upper surface and a lower surface of the lower channel structure LPC.

The source film SL may be in direct contact with the bottom surface of the lower channel structure LPC. The source film SL may be formed of the same material as the source film SL described with reference to FIG. 8A. The channel structure CH may be connected to the source film SL via the lower channel structure LPC.

Each of the drain select lines DSL and the word lines WL which are penetrated by the channel structure CH may include edges facing the memory film ML. Each of the edges may be covered with the material film M2 of an insulating structure. The material film M2 of the insulating structure may be the second material pattern M2A of the insulating structure IA described above with reference to FIGS. 2A to 2C, may be the second material pattern M2B of the insulating structure IB described above with reference to FIGS. 3A and 3B, or may be the second material pattern M2C of the insulating structure IC described above with reference to FIGS. 4A and 4B.

Figure 9D:
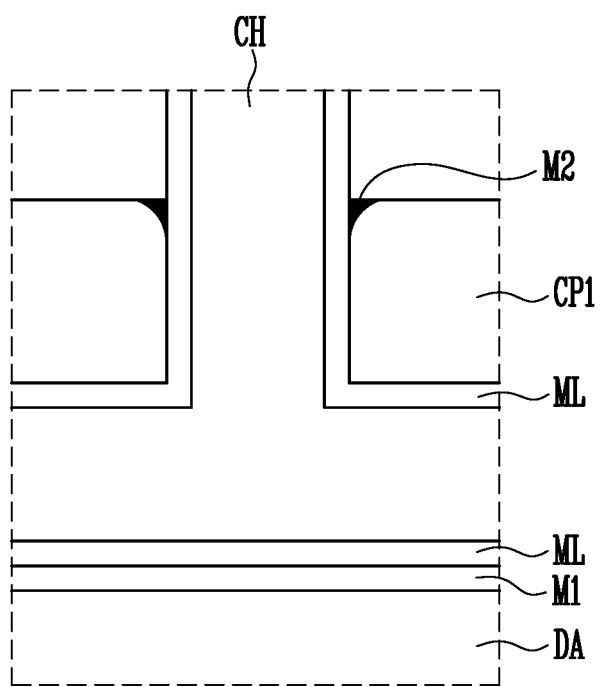

FIG. 9D is an enlarged view of a D region shown in FIG. 8D.

Referring to FIGS. 8D and 9D, the channel structure CH may include pillar portions PL penetrating the gate electrodes CP1 to CPn and a horizontal portion HP extending in a horizontal direction from the pillar portions PL. The horizontal portion HP of the channel structure CH may extend in parallel to a lower surface of the first pattern CP1. The horizontal portion HP may be disposed between a doped region DA and the first pattern CP1. The horizontal portion HP may be spaced apart from another horizontal portion by a slit extension portion SIE connected to the first slit SI1.

The doped region DA may be formed of a doped semiconductor film including a well dopant. The well dopant may include a p-type impurity. For example, the doped region DA may include p-type doped silicon.

Sidewalls of each of the pillar portions PL may be surrounded by the memory film ML. The memory film ML may extend between the corresponding horizontal portion HP and the first pattern CP1. The memory film ML may extend between the corresponding horizontal portion HP and the doped region DA.

The first material pattern M1 of an insulating structure may be disposed between the doped region DA and the horizontal portion HP. The gate electrodes CP1 to CPn may include edges facing the pillar portions PL. Each of the edges may be covered with the second material pattern M2 of an insulating structure. The first material pattern M1 may be the same material as the first material pattern M1A of the insulating structure IA described above with reference to FIGS. 2A to 2C, may be the same material as the first material pattern M1B of the insulating structure IB described above with reference to FIGS. 3A and 3B, or may be the same material as the first material pattern M1C of the insulating structure IC described above with reference to FIGS. 4A and 4B. The second material pattern M2 may be the second material pattern M2A of the insulating structure IA described with reference to FIGS. 2A to 2C, may be the second material pattern M2B of the insulating structure IB described above with reference to FIGS. 3A and 3B, or may be the second material pattern M2C of the insulating structure IC described above with reference to FIGS. 4A and 4B.

Figure 9E:
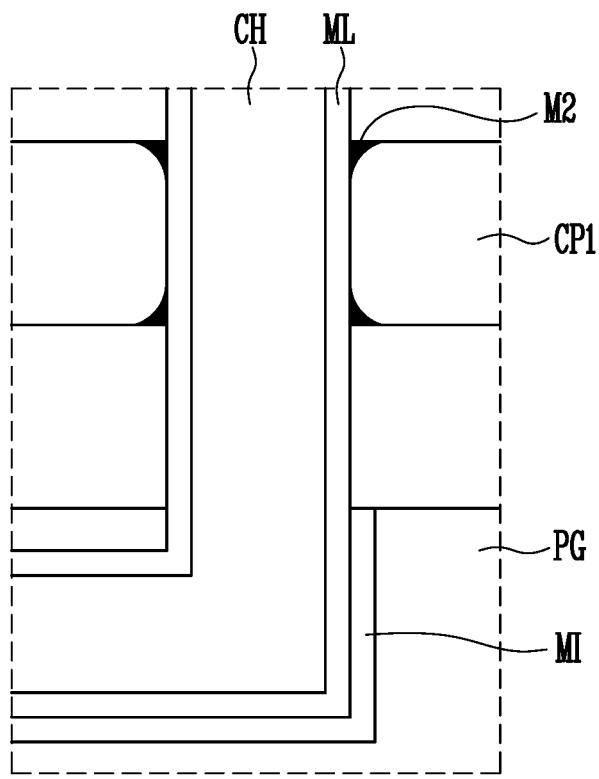

FIG. 9E is an enlarged view of a portion of the drain side word lines WL_D shown in FIG. 8E and a structure of a lower portion of the drain side word lines WL_D.

Referring to FIGS. 8E and 9E, the channel structure CH may include a source side pillar S_PL, a drain side pillar D_PL, and the horizontal portion HP. The drain side pillar D_PL may be electrically connected to the bit line BL. The drain side pillar D_PL penetrates the drain side stack body CP_D and is connected to the horizontal portion HP. The source side pillar S_PL may be electrically connected to the common source line CSL disposed between the bit line BL and the source side stack body CP_S. The source side pillar S_PL penetrates the source side stack body CP_S and is connected to the horizontal portion HP. The horizontal portion HP may be buried in a pipe gate PG. The pipe gate PG may be formed to be disposed under the source side stack body CP_S and the drain side stack body CP_D and to surround the horizontal portion HP. The pipe gate PG may be used as a gate of a pipe transistor. The pipe transistor may electrically connect the source side pillar S_PL and the drain side pillar D_PL through the horizontal portion HP in accordance with a signal transmitted to the pipe gate PG.

An outer wall of the channel structure CH may be surrounded by the memory film ML. The memory film ML may extend along the outer wall of the channel structure CH to open an upper surface of the drain side pillar D_PL and an upper surface of the source side pillar S_PL.

The first material pattern M1 of an insulating structure may be disposed between the pipe gate PG and the channel structure CH. The gate electrodes CP1 to CPn may include edges facing the source side pillar S_PL and the drain side pillar D_PL. Each of the edges may be covered with the second material pattern M2 of an insulating structure. The first material pattern M1 may be the same material as the first material pattern M1A of the insulating structure IA described above with reference to FIGS. 2A to 2C, may be the same material as the first material pattern M1B of the insulating structure IB described above with reference to FIGS. 3A and 3B, or may be the same material as the first material pattern M1C of the insulating structure IC described above with reference to FIGS. 4A and 4B. The second material pattern M2 may be the second material pattern M2A of the insulating structure IA described above with reference to FIGS. 2A to 2C, may be the second material pattern M2B of the insulating structure IB described above with reference to FIGS. 3A and 3B, or may be the second material pattern M2C of the insulating structure IC described above with reference to FIGS. 4A and 4B.

Operation reliability of the memory cell strings may be improved by applying the insulating structure IA described above with reference to FIGS. 2A to 2C, the insulating structure IB described above with reference to FIGS. 3A and 3B, and the insulating structure IC described above with reference to FIGS. 4A and 4B to the memory strings of the various structures described above with reference to FIGS. 8A to 8E.

Figure 11:
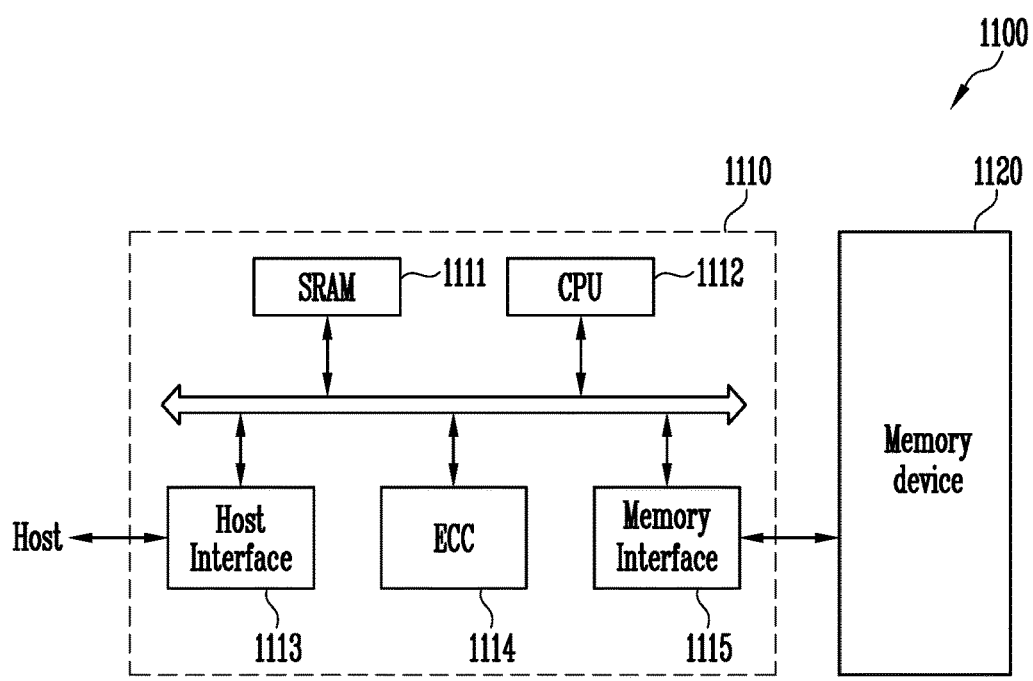
FIG. 11 is a block diagram illustrating a configuration of a memory system according to an embodiment of the present disclosure.

FIG. 11 is a block diagram illustrating a configuration of a memory system according to an embodiment of the present disclosure.

Referring to FIG. 11, the memory system 1100 according to an embodiment of the present disclosure includes a memory device 1120 and a memory controller 1110.

The memory device 1120 may be a multi-chip package configured of a plurality of flash memory chips. The memory device 1120 may include any one of the insulating structure IA described above with reference to FIGS. 2A to 2C, the insulating structure IB described above with reference to FIGS. 3A and 3B, and the insulating structure IC described above with reference to FIGS. 4A and 4B.

The memory controller 1110 is configured to control the memory device 1120 and may include a static random-access memory (SRAM) 1111, a CPU 1112, a host interface 1113, an error correction circuit (ECC) 1114, and a memory interface 1115. The SRAM 1111 may be used as an operation memory of the CPU 1112. The CPU 1112 may perform all control operations for data exchange of the memory controller 1110. The host interface 1113 may include a data exchange protocol of a host connected to the memory system 1100. The error correction circuit 1114 may detect and correct an error included in data read from the memory device 1120. The memory interface 1115 may perform interfacing with the memory device 1120. The memory controller 1110 may include a read only memory (ROM) that stores code data for interfacing with the host.

The memory system 1100 described above may be a memory card or a solid-state drive (SSD) with which the memory device 1120 and the memory controller 1110 are combined. For example, when the memory system 1100 is an SSD, the memory controller 1110 may communicate with an external device (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 12:
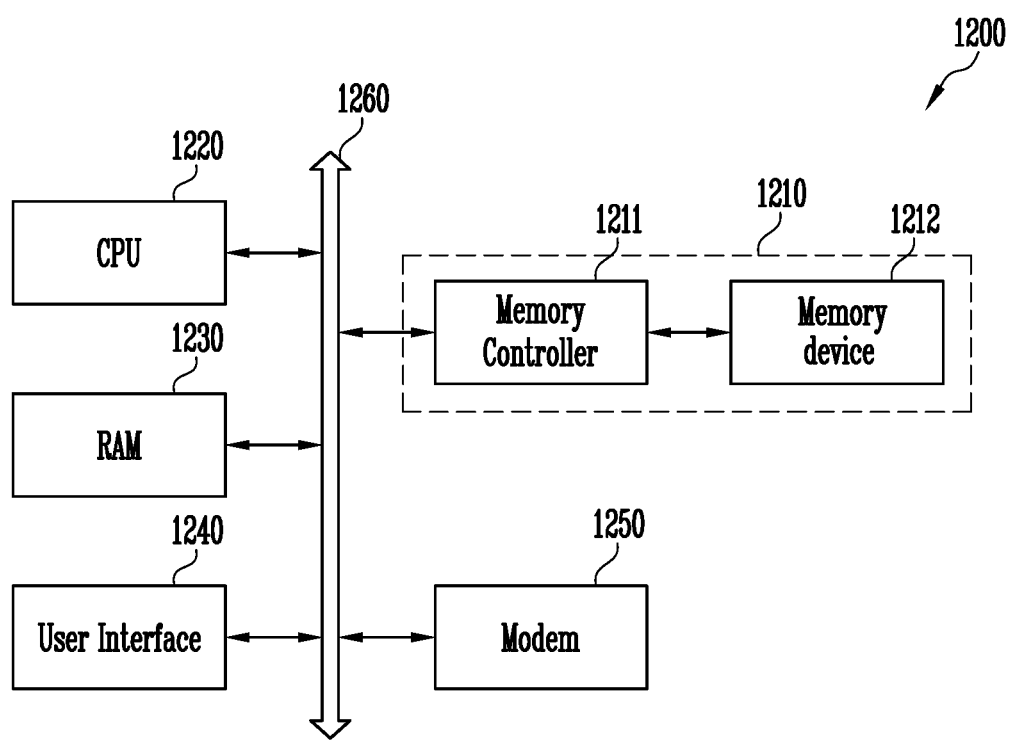
FIG. 12 is a block diagram illustrating a configuration of a computing system according to an embodiment of the present disclosure.

FIG. 12 is a block diagram illustrating a configuration of a computing system according to an embodiment of the present disclosure.

Referring to FIG. 12, the computing system 1200 according to an embodiment of the present disclosure may include a CPU 1220, a random-access memory (RAM) 1230, a user interface 1240, a modem 1250, and a memory system 1210, which are electrically connected to a system bus 1260. The computing system 1200 may be a mobile device and may also include a battery for supplying an operation voltage to the computing system 1200, an application chipset, a camera image processor (CIS), a mobile DRAM, and the like.

According to an embodiment of the present invention a fringing capacitance and a fringing field between the gate electrode and the channel structure may be reduced by using an insulating structure disposed between the interlayer insulating film and the channel structure.

According to an embodiment of the present invention a concentration of holes accumulated in a region between memory cells during an erase operation may be reduced by reducing the fringing capacitance between the gate electrode and the channel structure. Therefore, the embodiments of the present technology may improve the reliability of the semiconductor device by improving electron diffusion.

Various embodiments of the present may improve a phenomenon in which an electric field is concentrated at an edge of the gate electrode by reducing the fringing field between the gate electrode and the channel structure. Therefore, damage of the memory film due to the electric field concentrated on the edge of the gate electrode may be reduced. Thus, the embodiments of the present technology may improve the reliability of the semiconductor device.

Although various embodiments have been described for illustrative purposes, it will be apparent to those skilled in the art that various changes and modifications may be made without departing from the spirit and scope of the invention as defined in the following claims.

What is claimed is:

1. A method of manufacturing a semiconductor device, the method comprising:
    forming a stack body in which interlayer insulating films and sacrificial films are alternately stacked;
    forming a hole penetrating the stack body;
    forming a first material film on an inner wall of the hole;
    forming a channel structure in a center region of the hole opened by the first material film;
    removing the sacrificial films of the stack body to form opening portions exposing the first material film;
    removing exposed regions of the first material film through the opening portions so that the first material film is separated into first material patterns;
    forming second material patterns by oxidizing a portion of the first material patterns from an etched surface of each of the first material patterns; and
    forming gate electrodes filling the opening portions and extending between the second material patterns.

2. The method of claim 1, wherein the second material patterns extend to cover edges of the interlayer insulating films facing the channel structure.

3. The method of claim 1, wherein the gate electrodes include recessed portions in a shape corresponding to the second material patterns.

4. The method of claim 1, wherein the first material film includes at least one of a silicon oxynitride film (SiON), a silicon nitride film (SiN), and silicon (Si).

5. The method of claim 1, further comprising:
    forming a blocking insulating film on the first material film;
    forming a data storage film on the blocking insulating film; and
    forming a tunnel insulating film on the data storage film.

6. A method of manufacturing a semiconductor device, the method comprising:
    forming a stack body in which interlayer insulating films and sacrificial films are alternately stacked;
    forming a hole penetrating the stack body;
    forming a first material film on an inner wall of the hole;
    forming a memory film on the first material film;
    forming a channel structure in a center region of the hole opened by the memory film;
    removing the sacrificial films of the stack body to form first opening portions exposing the first material film;
    etching the first material film through the first opening portions so that second opening portions are defined between the interlayer insulating films and the memory film;
    forming second material patterns in the second opening portions; and
    forming gate electrodes filling the first opening portions and extending between the second material patterns.

7. The method of claim 6, wherein the memory film includes a blocking insulating film formed on the first material film, a data storage film formed on the blocking insulating film, and a tunnel insulating film formed on the data storage film.

8. The method of claim 6, wherein the first material film includes a silicon oxynitride film (SiON).

9. The method of claim 6, wherein the second material patterns include a porous insulating material filling the second opening portions.

10. The method of claim 6, wherein the forming the second material patterns comprises:
- forming a second material film along surfaces of the interlayer insulating films so that a void is formed in each of the second opening portions; and
- etching the second material film so that the second material patterns remain on edges of the interlayer insulating films facing the channel structure.

11. The method of claim 10, wherein the gate electrodes are spaced apart from the void by the second material patterns which are in contact with the interlayer insulating films.

* * * * *